(12) United States Patent
Kuyel

(10) Patent No.: US 7,283,082 B1
(45) Date of Patent: Oct. 16, 2007

(54) HIGH-SPEED, HIGH-RESOLUTION VOLTAGE OUTPUT DIGITAL-TO-ANALOG CONVERTER AND METHOD

(75) Inventor: Turker Kuyel, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/454,595

(22) Filed: Jun. 16, 2006

(51) Int. Cl.
*H03M 1/12* (2006.01)

(52) U.S. Cl. ...................... 341/155; 341/145

(58) Field of Classification Search ............... 341/145, 341/155, 144
See application file for complete search history.

(56) References Cited

U.S. PATENT DOCUMENTS

| | | | |
|---|---|---|---|
| 5,079,552 A | 1/1992 | Pelgrom et al. | 341/148 |
| 5,396,245 A * | 3/1995 | Rempfer | 341/145 |
| 5,859,606 A * | 1/1999 | Schrader et al. | 341/144 |
| 6,246,351 B1 | 6/2001 | Yilmaz | 341/145 |
| 6,469,647 B1 * | 10/2002 | Kinugasa et al. | 341/145 |
| 6,642,869 B2 | 11/2003 | Kuyel et al. | 341/120 |
| 6,970,122 B1 * | 11/2005 | Yilmaz et al. | 341/145 |

* cited by examiner

*Primary Examiner*—Jean Bruner Jeanglaude
(74) *Attorney, Agent, or Firm*—Wade J. Brady, III; Frederick J. Telecky, Jr.

(57) ABSTRACT

A string DAC having $2^M$ string resistors includes a plurality of switches for selectively coupling, according to the decoding of an M-bit MSB subword, the voltage across a string resistor to an interpolation sub-DAC which interpolates it according to the decoding of an N-bit mid-subword. The voltage across the string resistor is multiplexed, according to the decoding of an N-bit mid-subword, to various inputs of $2^N$ differential transistor pairs of an interpolation amplifier. A P-bit delta sigma modulator produces a delta sigma modulated signal, according to a P-bit LSB subword, to control multiplexing of voltages on the terminals of the string resistor to an input of one of the differential transistor pairs selected by decoding of the N-bit mid-subword to monotonically average a contribution of the selected differential transistor pair to generation of an output voltage representing a word including the M-bit, N-bit, and P-bit subwords.

20 Claims, 9 Drawing Sheets

HIGH-SPEED, HIGH-RESOLUTION VOLTAGE OUTPUT DIGITAL-TO-ANALOG CONVERTER AND METHOD

BACKGROUND OF THE INVENTION

The present invention relates generally to improving the speed and settling characteristics of high resolution digital to analog converters (DACs), and more particularly to improving the speed and settling characteristics of high resolution DACs of the type including a string DAC stage and an interpolation amplifier sub-DAC stage. The invention also relates to further increasing the resolution of DACs of the type including a string DAC stage and an interpolation amplifier sub-DAC stage.

High-speed DACs using current source array structures need to generate currents of the order of 20 mA (milliamperes) in order to achieve 16-bits of fine resolution. These DACs have precision voltage settling errors due to self-heating caused by large currents forced through resistors or through the feedback resistors of I-to-V (current-to-voltage) converters. Also, changing load conditions will linearly affect the settling voltage values of voltage values for current output DACs (IDACs).

DACs based on voltage division (i.e., string DACs) have the desirable characteristics of monotonicity, output voltage stability, low differential non-linearity (DNL), and low "glitch" voltage magnitudes and durations. However, due to inherent RC time constants, voltage division or string DACs are not very suitable for achieving high speed conversions at high resolution. Also, due to the "random-walk" kind of pattern that is inherently involved in the matching of untrimmed resistors connected in a series combination, the integral linearity (INL) of voltage division DACs is not better than approximately 10 bits. Various schemes have been proposed to improve both the linearity and speed of voltage division DACs. Historically, resistor string DAC architectures have been used in high-speed FLASH DACs because of their simplicity and parallel nature wherein all tap voltages of the DAC are available at all times. A need for reducing the resistor string impedance arose to improve the conversion speed, and various solutions for achieving this were developed.

However, during the last decade voltage division DAC architecture lost its popularity for high speed applications because inexpensive DACs having current cell arrays provide orders of magnitude higher sampling rates and reasonably high resolution. For high precision applications, string resistor voltage division DAC architecture has not gained in popularity because it has been very costly to laser-trim the large number of series resistors. Furthermore, in DACs of the kind including R-2R ladders, the required laser-trimming of the resistors has been more economical because a smaller number of resistors is required. Also, high resolutions up to 24 bits have been achieved using delta-sigma DACs, but at very slow conversion speeds.

As the number of resistors in the resistor string DAC stage is increased (e.g., to 10 or even 12 bits), the difference between the string DAC tap voltages VH and VL for each string resistor is reduced to a value between roughly 1 and 4 millivolts, assuming that a precise reference voltage of about 4 volts is being applied across the resistor string, for a typical 5 volt CMOS manufacturing process. Depending on the $V_T$ (threshold voltage) mismatch of the input transistors of the differential amplifier, such a small voltage drop across each string resistor could cause DNL problems because of random variation in the transconductance of each differential input transistor pair. It is believed that a 10-bit resistor string (with $2^{10}$ resistors) is about the largest that can be used and still have an acceptably low DNL, for the case in which 4 volts is applied across the resistor string.

During the last decade, most applications of voltage division DACs in the 8-12 bit range have been in small, low power, low cost, mass-market DAC applications. A 10-bit resistor string with 2-bits of segmentation has provided a good compromise with respect to the amount of chip area required, making multi-channel, low cost string DACs popular in the market. However, achieving monotonicity with "10-4 segmentation" in 14-bit string DACs has resulted in poor manufacturing yields, so 14-bit segmented string DACs have not become popular using conventional analog summing techniques that could not ensure monotonicity.

To summarize, basic, practical high-speed string DACs have not achieved resolutions higher than approximately 10-bits because of their size and complexity.

More recently, a multi-input interpolation amplifier structure has been utilized. One such amplifier is shown in U.S. Pat. No. 5,396,245 by W. C. Rempfer. "Prior Art" FIG. 1 herein is a copy of FIG. 5 of the '254 patent by Rempfer The described interpolation amplifier includes N differential input transistor pairs with (−) side terminals connected together and (+) side terminals externally used as N distinct inputs. Consecutive tap voltages (VH and VL) on the terminals of a string resistor selected by MSB decoding are coupled to the N separate (+) side inputs of the interpolation amplifier, which produces an output voltage that is an average of the voltages applied to the (+) inputs. This structure does not take into account variation of the input transistor transconductances with respect to changing of the interpolation amplifier inputs and has poor integral linearity (INL) properties for the sub-DAC formed by the interpolation amplifier. An improvement can be achieved without using degeneration resistors by separating the tail currents of the N differential input transistor pairs into N equal segments in the manner disclosed in commonly owned U.S. Pat. No. 6,246,351 "LSB Interpolation Circuit and Method for Segmented D/A Converter" issued Jun. 12, 2001 to Yilmaz. "Prior Art" FIG. 2 herein is a copy of FIG. 2 of the '351 Yilmaz patent. The disclosed structure provides good INL for the interpolation amplifier, although overall linearity of the DAC is still dominated by mismatches in the resistor string.

Reducing the size of each differential input transistor pair in the interpolation amplifier stage is difficult, and causes the integrated circuit layout and input transistor matching also to be difficult. The amount of parasitic capacitance increases unacceptably as the number of bits of the interpolation amplifier exceeds 8. In view of the foregoing considerations, 16-18 bits of resolution can be considered to be a reasonable upper limit for DACs of the type including a conventional string DAC stage followed by an interpolating amplifier sub-DAC stage.

X-Y decoding of an array of string resistors in a string DAC is disclosed in U.S. Pat. No. 5,079,552 issued Jan. 7, 1992 to Pelgrom et al.

The accuracy of a resistor-string-based DAC suffers from random-walk type INL errors. That is, the accuracy randomly changes, causing correspondingly random INL errors. The inaccuracy in this type of DAC is caused by random inaccuracies in the resistor string, and can be calibrated in various ways, for example as described commonly assigned U.S. Pat. No. 6,642,869 entitled "Piece-wise Linear Calibration Method and Circuit to Correct the Transfer Function Errors of D/A Converters" issued May 1, 2002 to T. Kuyel and P. L. Parthasarathy, wherein a memory is used to store the required DC calibration coefficients. The memory can be programmed during production testing, and its contents could be transferred to SRAM or DRAM during circuit power-up. The memory could be addressed so that calibration coefficients for a piece-wise linear approximation are loaded into an arithmetic logic unit to generate the calibration codes. When the calibration coefficients are loaded from the SRAM, it is possible to achieve calibration at speeds exceeding 20MSPS (mega-samples per second) at the present state-of-the-art.

The interpolation amplifier structure of above-mentioned U.S. Pat. No. 6,246,351 by Yilmaz does not require substantial input current for CMOS implementations, and it interpolates almost linearly between the two selected string resistor tap voltages. This has resulted in a new generation of segmented monotonic voltage output string DACs having 16-bits of resolution which provide low power, low cost, small die area, exceptionally good DNL (differential nonlinearity), and stable output voltages, but which also suffer from relatively poor INL and low-speed. At the same time, smaller CMOS geometries have enabled arithmetic logic units (ALUs) and FLASH memory to be economically incorporated in DAC cores utilized in various integrated circuits. This generation of segmented string DACs provides a good combination of power, cost, size and accuracy that may rival traditional laser-trimmed R-2R structures.

Since integrated circuit technology is presently capable of the foregoing 16-bit precision segmented string DACs, it would be desirable to provide further improvements in such DACs that could provide high sampling rates and faster precision output voltage settling characteristics. This would be desirable because presently available 16-bit current steering array structures are capable of very high sampling speeds exceeding 500 MHz, but an inherent problem with DACs having such architectures is the necessity of keeping the maximum output current at a relatively high level (e.g., roughly 20 milliamperes) in order to provide adequately fast resolving of the least significant bits. Self-heating occurs when this amount of output current is forced through resistors to provide a current-to-voltage conversion, and this causes the settling accuracy of the DAC output voltage to be significantly degraded. Such high speed current output DACs usually are not utilized for applications requiring output voltage settling any more accurate than 10 bits (0.1% FSR (full scale range)). However, a substantial number of high-speed control applications, especially in fiber optics, need precision output voltage settling at high sampling speeds.

There is an unmet need for a fast segmented DAC of the type including a string DAC as a first stage followed by interpolation amplifier as a second DAC stage and which achieves very high speed and fast output voltage settling at high resolution.

There also is an unmet need for a fast DAC of the type including a string DAC as a first stage followed by an interpolation amplifier as a second DAC stage, and having 24 bit resolution, high speed operation, and fast output voltage settling.

There also is an unmet need for a string DAC architecture with sub-word interpolation which can provide 24-bits of resolution with 10 microsecond output voltage settling with +−0.01 millivolts of absolute accuracy when driving a load that changes with temperature and time.

There also is an unmet need for a high-resolution, fast settling string DAC architecture with sub-word interpolation which can provide a high analog output voltage range, for example from −5 volts to +5 volts, manufactured using conventional low voltage transistor fabrication processes with minimal or no process modification.

SUMMARY OF THE INVENTION

It is an object of the invention to provide a fast segmented DAC of the type including a string DAC as a first stage followed by interpolation amplifier as a second DAC stage and which achieves very high speed and fast output voltage settling at high resolution.

It is another object of the invention to provide a fast DAC of the type including a string DAC as a first stage followed by interpolation amplifier as a second DAC stage, and having 24 bit resolution, high speed operation, and fast output voltage settling.

It is another object of the invention to provide a string DAC architecture with sub-word interpolation which can provide 24-bits of resolution with 10 microsecond output voltage settling with +−0.01 millivolts of absolute noise-averaged accuracy when driving a load that changes with temperature and time.

It is another object of the invention to provide a high-resolution, fast settling string DAC architecture with sub-word interpolation which can provide a high analog output voltage range, for example from −5 volts to +5 volts, manufactured using conventional low voltage transistor fabrication processes with minimal or no process modification.

Briefly described, and in accordance with one embodiment, the present invention provides a string DAC (4) having $2^M$ string resistors includes a plurality of switches (13) for selectively coupling, according to the decoding of an M-bit MSB subword, the voltage across a string resistor to an interpolation sub-DAC (8) which interpolates it according to the decoding of an N-bit mid-subword. The voltage across the string resistor is multiplexed, according to the decoding of an N-bit mid-subword, to various inputs of $2^N$ differential transistor pairs of an interpolation amplifier (32). A P-bit delta sigma modulator (10) produces a delta sigma modulated signal (C,CB), according to a P-bit LSB subword, to control multiplexing of voltages on the terminals of the string resistor to an input of one of the differential transistor pairs selected by decoding of the N-bit mid-subword to monotonically average a contribution of the selected differential transistor pair to generation of an output voltage (Vout) representing a word including the M-bit, N-bit, and P-bit subwords.

In one embodiment, the invention provides a DAC for converting a digital input word (DIN) including an M-bit MSB subword, an N-bit mid-subword, and a P-bit LSB subword to an analog output signal (Vout), including a string DAC (4) having $2^M$ string resistors each sequentially connected to the next by a plurality of tap voltage conductors, respectively, a first group of switches (13) for selectively coupling an upper tap voltage of a selected string resistor to one of a first string DAC output conductor (5) and a second string DAC output conductor (6) and for selectively coupling a lower tap voltage of the selected string resistor to the other of the first (5) and second (6) string DAC output conductors in accordance with decoding of the M-bit MSB subword by a MSB subword decoder (14). In interpolation sub-DAC (8) monotonically interpolates a voltage between the first (5) and second (6) string DAC output conductors in response to decoding of the N-bit mid-subword by a first decoder (18). The interpolation sub-DAC (8) includes interpolation operational amplifier circuitry (32) including $2^N$ differential transistor pairs and multiplexing circuitry (20, 22) receiving the upper and lower tap voltages from the first (5) and second (6) string DAC output conductors for distributing the upper and lower tap voltages to various inputs of the differential transistor pairs in response to outputs of the first decoder (18) in accordance with values of the N-bit mid-subword. A P-bit delta sigma modulator (10) produces a delta sigma modulated signal (C,CB) including sequences of pulses the density of which correspond to values of the P-bit LSB subword and applies the delta sigma modulated signal (C,CB) to an input of the multiplexing circuitry (22) to control alternate supplying of the upper and lower tap voltages to an input of a differential transistor pair of the interpolation operational amplifier circuitry (32) selected by a second decoder (17) in accordance with the N-bit mid-subword to monotonically average a contribution of the selected differential transistor pair to generation of the analog output signal (Vout) in accordance with the values of the P-bit LSB subword.

In a described embodiment, the switches (13) of the first group are CMOS transmission gate switches, and the gate of a P-channel transistor (13B) of each CMOS transmission gate switch (13) is bootstrap-coupled to a substantially lower voltage tap voltage conductor than a voltage of a tap conductor to which a source or drain of that P-channel transistor (13B) is connected and wherein the gate of a N-channel transistor (13A) of that CMOS transmission gate switch (13) is bootstrap-coupled to a substantially higher voltage tap voltage conductor than the voltage of the tap conductor to which the source or drain of that P-channel transistor (13B) is connected, to ensure fast, accurate sampling of the tap voltage of the voltage tap conductor to which the source or drain of that P-channel transistor (13B) is connected.

In the described embodiment, all of the differential transistor pairs are disposed in semiconductor well material biased at a common bulk bias voltage (VB) by a bias amplifier (51) which generates the common bulk bias voltage (VB) in response to a signal representative of the analog output signal (Vout).

In one embodiment, the interpolation operational amplifier (32) includes a first group of differential transistor pairs which are grouped together by binary decoding and a second group of differential transistor pairs which are grouped together by unary decoding to reduce the glitch voltages on gates of transistors of the first group due to injected charge from a single switch actuated in order to select the first group. A sub-group of transistors of the second group are capacitor-connected so as to reduce glitch voltage on a conductor coupled to gates of the transistors of the second group due to injected charge from another single switch actuated in order to select the second group.

In one embodiment, the differential transistor pairs each include a first input transistor and a second input transistor having their sources coupled together, gates of the second input transistors being coupled to feedback from the analog output signal (Vout), gates of the first input transistors being the various inputs of the differential transistor pairs receiving the distributed upper and lower tap voltages. The differential transistor pairs are grouped into a plurality of groups, each group including a plurality of the differential transistor pairs wherein sources of the first and second transistors of that group are connected by a common source conductor (25) to a corresponding tail current source (10), drains of the first transistors of that group being coupled to a first conductor (24A), drains of the second transistors of that group being coupled to a second conductor (26A), wherein the transistors of the plurality of differential transistor pairs are low voltage transistors, each group including a first voltage clamp coupled between the common source conductor (25) and the first conductor (24A), a second voltage clamp coupled between the common source conductor (25) and the second conductor (26A), and a third voltage clamp coupled between the first conductor (24A) and the second conductor (26A), wherein each of the first, second, and third clamp circuits includes a pair of back-to-back diode-connected high voltage transistors.

In a described embodiment, the $2^M$ string resistors (Ri) are arranged in a plurality of loops, each loop having a mid-point (38) and including a first bypass resistor (37-1), the bypass resistors of the loops forming a direct low-impedance path between a first reference voltage (VDD) and a second reference voltage (GND). Each loop includes a second bypass resistor (37-2), each loop including a mid-point (38) connected directly to a junction between the first (37-1) and second (37-2) bypass resistors. A second group of switches (S0,1,2 . . . ) couples alternate successive tap voltage points between the string resistors to the first (5) and second (6) string DAC output conductors, respectively, and a plurality of X-Y decode circuits (42-0,1,2 . . . ) coupled to the second group of switches (S0,1,2 . . . ) operates to couple both tap voltages of a selected string resistor to the first (5) and second (6) string DAC output conductors.

In one embodiment, a second group of switches (S0, 1, . . . ) couples alternate successive tap voltage points between the string resistors to the first (5) and second (6) string DAC output conductors, respectively, and a plurality of X-Y decode circuits (42-0,1,2 . . . ) in each loop are coupled to corresponding switches (S0,1,2 . . . ) of the first group and operative to couple both tap voltages of a selected string resistor to the first (5) and second (6) string DAC output conductors, and also includes first (S5) and second (S6) switches of the second group adjacent to the midpoint of a particular loop operatively coupled in response to first and second X-Y decode circuits to precharge the first (5) and second (6) string DAC output conductors to the voltage of the mid-point of that loop.

In one embodiment, a ground reference voltage is applied to an upper end conductor of the $2^M$ string resistors and an internally generated negative reference voltage (−Vref) is applied to a lower end conductor (35) of the $2^M$ string resistors. An operational amplifier (34) has a first input coupled to the ground reference voltage and a second input coupled by a gain resistor to a positive reference voltage (+Vref) and also coupled by a feedback resistor to the lower end conductor (35) to generate the internally generated negative reference voltage (−Vref).

In one embodiment, the invention provides a method of converting a digital input word (DIN) including an M-bit MSB subword, an N-bit mid-subword, and a P-bit LSB subword to an analog output signal (Vout) by selectively coupling upper and/or lower tap voltages of a selected string resistor of a string DAC (4) including $2^M$ string resistors each sequentially connected to the next by a plurality of tap voltage conductors, respectively, by means of a plurality of switches (13) to first (5) and second (6) string DAC output conductors in accordance with decoding of the M-bit MSB subword monotonically interpolating a voltage between the first (5) and second (6) string DAC output conductors by means of operational amplifier circuitry (32) including $2^N$ differential transistor pairs in response to decoding of the N-bit mid-subword by a first decoder (18), and monotonically averaging a contribution of at least one of the differential transistor pairs selected in accordance with values of the N-bit mid-subword to generation of the output signal (Vout) by producing a delta sigma modulated signal (C,CB) including sequences of pulses the density of which correspond to values of the P-bit LSB subword and applying the upper and lower tap voltages of a selected string resistor to an input of the selected differential transistor pair in response to the delta sigma modulated signal (C,CB).

In one embodiment, the invention provides a DAC for converting a digital input word (DIN) including an M-bit MSB subword, an N-bit mid-subword, and a P-bit LSB subword to an analog output signal (Vout), including means for selectively coupling upper and/or lower tap voltages of a selected string resistor of a string DAC (4) including $2^M$ string resistors each sequentially connected to the next by a plurality of tap voltage conductors, respectively, by means of a plurality of switches (13) to first (5) and second (6) string DAC output conductors in accordance with decoding of the M-bit MSB subword, means for monotonically interpolating a voltage between the first (5) and second (6) string DAC output conductors by means of operational amplifier circuitry (32) including $2^N$ differential transistor pairs in response to decoding of the N-bit mid-subword by a first decoder (18), and means for monotonically averaging a contribution of at least one of the differential transistor pairs selected in accordance with values of the N-bit mid-subword to generation of the output signal (Vout) by producing a delta sigma modulated signal (C,CB) including sequences of pulses the density of which correspond to values of the P-bit LSB subword and applying the upper and lower tap voltages of the selected string resistor to an input of a selected differential transistor pair in response to the delta sigma modulated signal (C,CB).

DETAILED DESCRIPTION OF THE PREFERRED EMBODIMENTS

One embodiment of the invention provides a fast settling, low drift, monotonic DAC including a segmented 16-bit string DAC as a first stage which receives an MSB group of bits or MSB subword of the digital input word DIN, and also includes an interpolating amplifier as a second stage which receives a "mid-group" of the bits of the digital input word. The gate of at least one of the differential input transistor pairs of the interpolation amplifier is modulated by means of a delta-sigma modulator in response to an LSB group of the bits of the digital input word, in order to obtain very high resolution without significantly deteriorating output voltage settling time or output noise.

To achieve the desired high speed and precision output voltage settling, a very fast resistor string is provided to generate the tap voltages of the string resistor which has been selected in response to the MSB subword. For the "mid-bits" of the digital input word, an interpolation amplifier sub-DAC is used to ensure monotonicity of the segmented DAC and very fast settling of the analog output voltage at the 16-bit resolution level. Delta sigma modulation in response to the LSB subword is used to increase the resolution of the DAC and to provide monotonic linear averaging at the LSB level.

Figure 3:
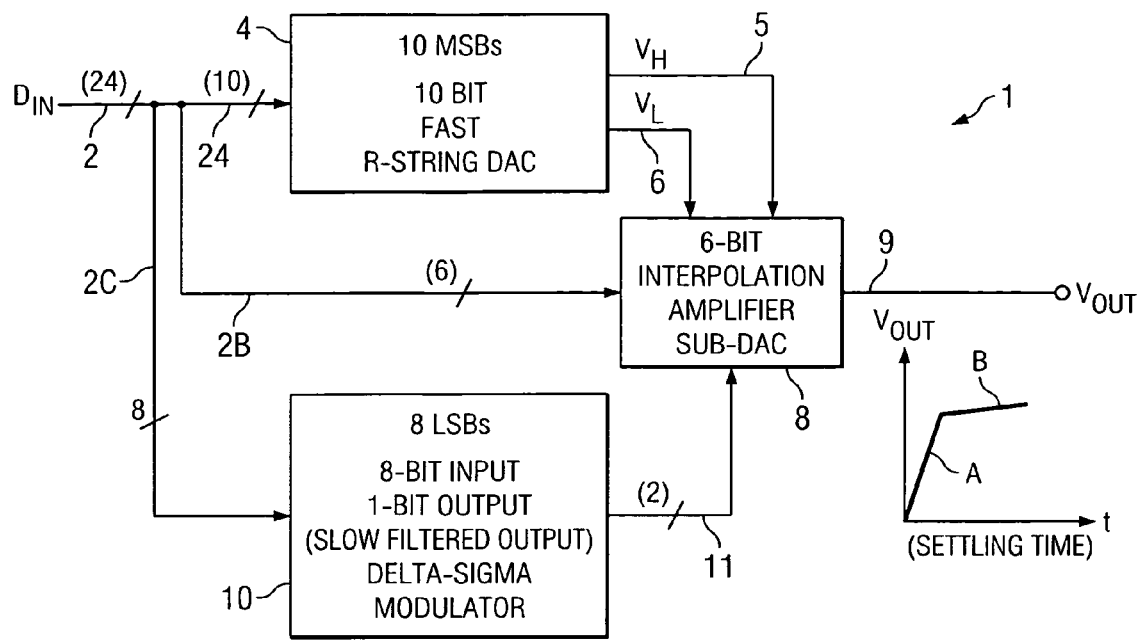
FIG. 3 is a block diagram of a preferred embodiment of the present invention.

FIG. 3 shows a DAC 1 in which a 24-bit digital input word DIN is applied to a 24 conductor digital input bus 2. Digital input word DIN includes a 10-bit MSB subword applied by 10 conductors 2A to a 10-bit "fast" resistor string DAC 4. Input bus 2 also includes the next most-significant bits of digital input word DIN as a "mid-subword" which are applied by 6 conductors 2B to the input of an interpolation amplifier 8, which functions as a 6-bit sub-DAC. At least one of the differential input transistor pairs of interpolation amplifier 8 is modulated by a 1-bit output of a delta-sigma modulator 10 in response to a 8-bit LSB subword of digital input word DIN. Although delta-sigma modulator 10 operates at a high clock signal rate, its filtered output signal on conductor(s) 11 is relatively slow. The output of interpolation amplifier sub-DAC 8 is the analog output signal Vout. As subsequently explained, output signal Vout has a fast settling time to within 16-bit accuracy, as indicated by section A of the Vout versus time curve and a slower settling time to 24-bit accuracy, as indicated by section B of the Vout versus time curve shown in FIG. 3.

Figure 4A:
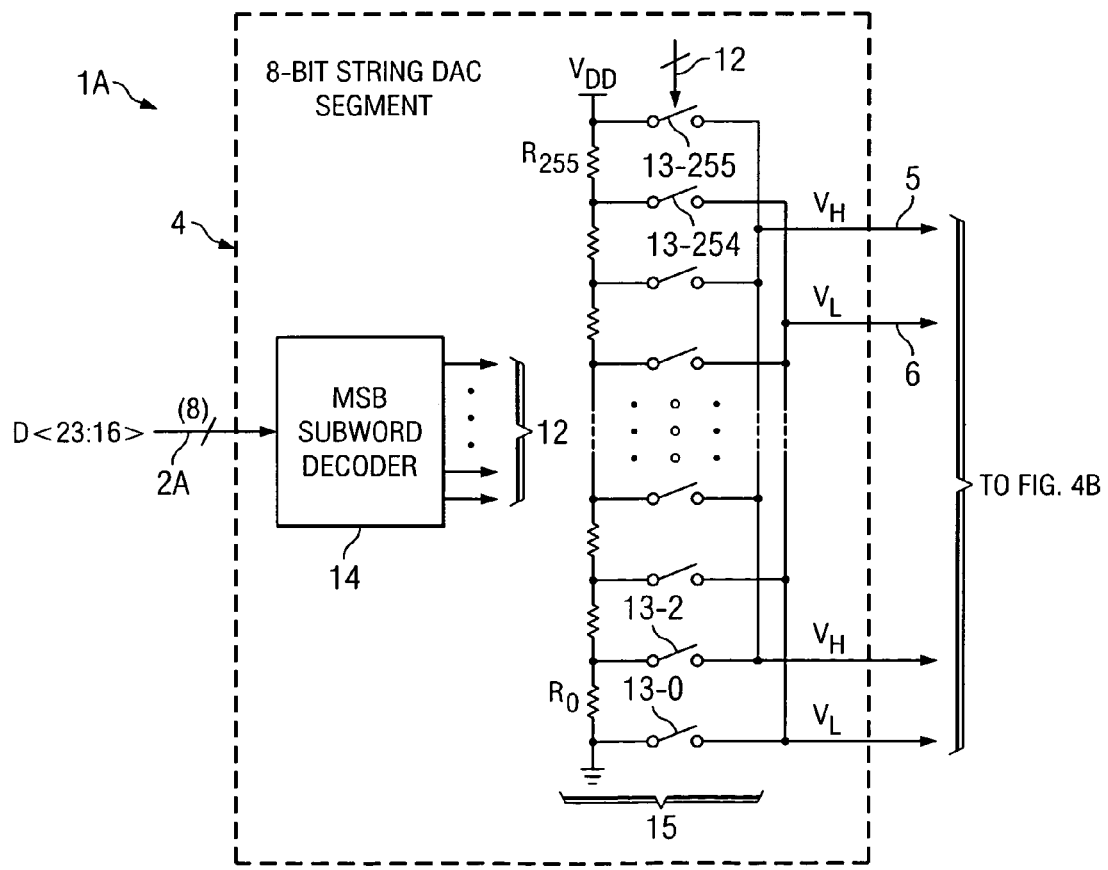
FIGS. 4A and 4B constitute a more detailed diagram of another preferred embodiment of the present invention.
Figure 4B:
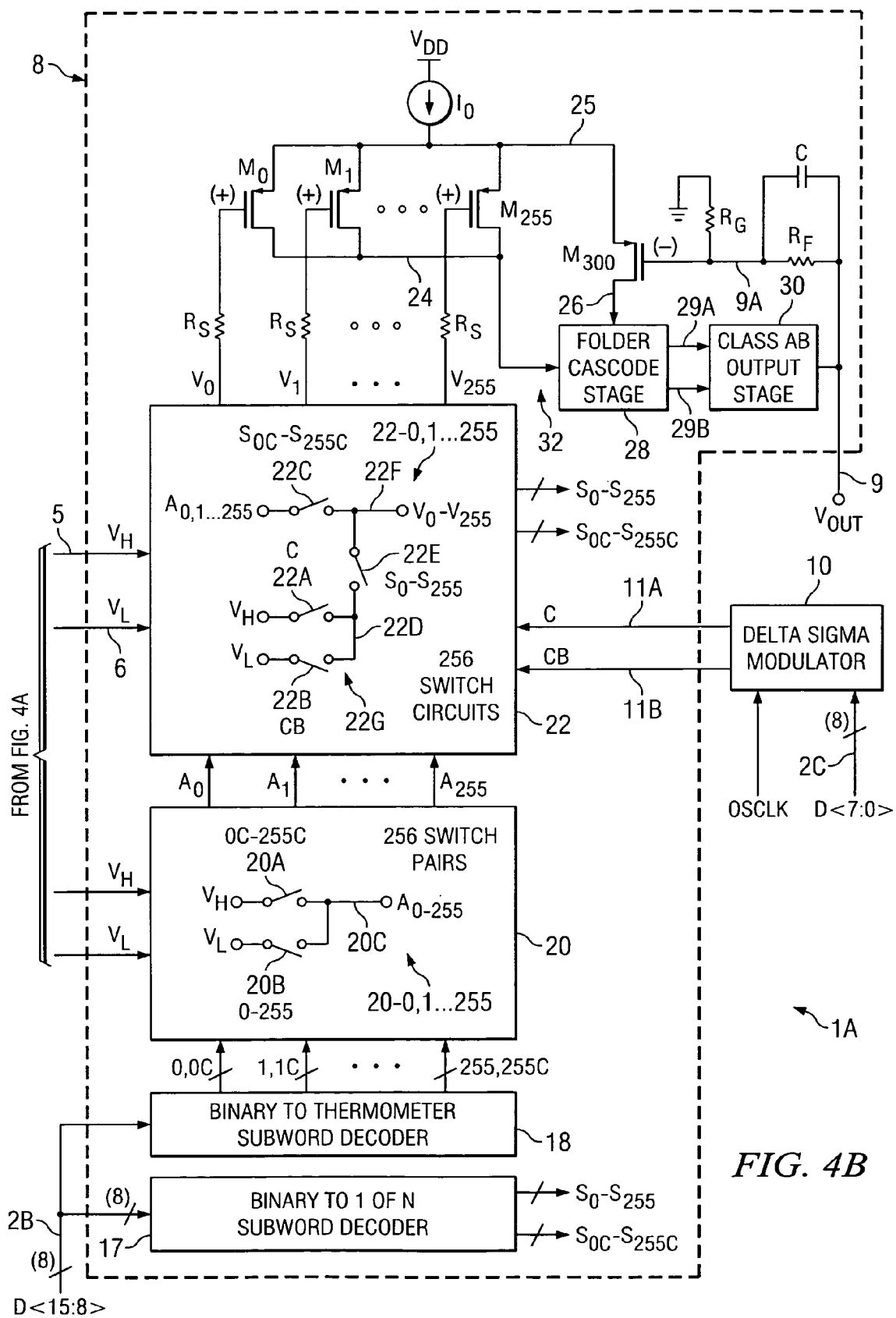

FIGS. 4A and 4B show a more detailed diagram of a 24-bit DAC 1A that is generally the same as the DAC 1 shown in FIG. 3 except string DAC 4 in FIGS. 4A and 4B is an 8-bit DAC rather than a 10-bit DAC and interpolation amplifier sub-DAC 8 in FIGS. 4A and 4B is an 8-bit rather than a 6-bit DAC. Referring to FIGS. 4A and 4B, string DAC 4 includes an eight-bit MSB subword decoder 14 which receives 8 MSB bits, designated D<23:16>, of input word DIN. The 256 outputs 12 of MSB subword decoder 14 are applied to appropriate switches 13-0,1, . . . 255 each having a first terminal connected to a corresponding tap point of a resistor string 15 including 256 resistors R0,1, 2 ... 255 connected in series between VDD and ground. The second terminals of the even-numbered switches 13-0,2, 4 ... 254 are connected to conductor 5 to produce thereon the upper tap voltage VH of one string resistor and the lower tap voltage VL of the next string resistor. Similarly, the second terminals of the odd-numbered switches 13-1,3, 5 ... 255 are connected to conductor 6 to produce thereon a voltage which is the lower tap voltage VL of one string resistor and the upper tap voltage VH of the next string resistor. (Those skilled in the art will understand that the decoder 18 causes appropriate decoding and selection of the resistor string tap voltages such that only a single switch 13 needs to be connected to each tap voltage of resistor string 15. Further details of string DAC 4 are subsequently described with reference to FIGS. 7-11.

Eight-bit interpolation amplifier sub-DAC 8 in FIGS. 4A and 4B includes a binary to thermometer subword decoder 18 which decodes the 8 mid-bits designated D<15:8> to produce 256 output signals and their logical complements, designated 0,0C, 1,1C 2,2C ... 255,255C which are applied as inputs to 256 multiplexer switch pairs in block 20. Each of the switch pairs includes a switch 20A having one terminal coupled to receive VH and another terminal coupled to a conductor 20C. Each of the switch pairs also includes a switch 20B having one terminal coupled to receive VL and other terminal coupled to conductor 20C. The control terminals of the 256 switches 20A coupled to VH are controlled by the various outputs 0C through 255C produced by binary to thermometer subword decoder 18, and the control terminals of the various switches 20B coupled to VL are controlled by the various outputs 0-255 produced by binary to thermometer subword decoder 18. This results in the switches in block 20 producing 255 control signals in the group A0,A1 ... A255, that is, all of the signals in the group A0,A1 ... A255 except one signal that is selected by binary to 1 of N subword decoder 17. Binary to 1 of N subword decoder 17 selects which of an differential input pair transistors of the interpolation amplifier 32 are to be modulated by delta-sigma modulator 10. Binary to 1 of N subword decoder 17 also receives the 8 mid-bit subword designated D<15:8> on 8-bit bus 2B and produces 256 selection signals S0-S255 and their respective logical complements S0C-S255C.

Interpolation amplifier 32 in FIG. 4B has a conventional operational amplifier architecture including a differential input stage, a folded cascode stage 28, and a class AB output stage 30. The differential input stage includes P-channel input transistors M01,2 ... 255 as shown in FIGS. 4A and 4B.

The outputs A0,A1 ... A255 produced by block 20 in response to the outputs S0-S255 and their respective logical complements S0C-S255C produced by binary to of N subword decoder 17 are applied as inputs to 256 switch circuits 22G, one of which is shown in block 22. In block 22, switching circuit 22G includes four switches 22A, 22B, 22C and 22E. One terminal of switch 22A is coupled to VH, and another terminal of switch 22A is connected to conductor 22D. The control terminal of switch 22A receives a signal C via conductor 11 from delta-sigma modulator 10. Similarly, one terminal of switch 22B is coupled to VL and its other terminal is connected to conductor 22D. The control terminal of switch 22B receives a signal CB via conductor 11B from delta-sigma modulator 10. One terminal of switch 22E is connected to conductor 22D and its other terminal is connected to conductor 22F. The control terminal of switch 22E receives a corresponding one of the signals S0-S255 produced by binary to 1 of N subword decoder 17. One terminal of switch 22C is connected to a corresponding one of the output signals A0,1,2 ... 255 produced by the switch circuitry in block 20, another terminal of switch 22C is connected to conductor 22F, and the control terminal of switch 22C receives a corresponding one of the signals S0C-S255C produced by binary to 1 of N subword decoder 17. The various 256 conductors 22F receive the various VH and VL levels of the signals A0,1 ... 255 to thereby generate the signals V0,1,2 ... 255 produced by block 22. The signals V0,1,2, ... 255 are coupled through corresponding series resistors RS to the gates of P-channel input transistor M0,1, 2 ... 255 of above mentioned interpolation amplifier 32, respectively.

The multiplexer switch circuitry in block 22 is necessary because typically the gate of only one of the differential stage input transistors is to be delta-sigma modulated, and the multiplexer switch circuitry operates to hold the gates of the other input transistors at either DH or VL in accordance with the outputs of binary to thermometer subword decoder 18. (However, the gate of more than one of the differential stage input transistors could be delta-sigma modulated.)

The differential input transistor pairs are included in the input stage of a multistage operational amplifier which also includes folded-cascode stage 28 followed by class AB output stage 30. The input stage includes multiple "(+) side" inputs and a single "(−) side" input. The (−) side input is connected by conductor 9A and a feedback circuit RG,RF,C to the operational amplifier output Vout. The (+) inputs of the differential input stage receive the upper tap voltage VH and the lower tap voltage VL of the selected resistor of resistor string 15. In accordance with the present invention, the VH and VL tap voltages applied to the gate of the selected (+) input transistor selected by binary to 1 of N decoder 17 are modulated by means of delta-sigma modulator 10.

Thus, the binary to thermometer subword decoder 18 selects all but one of the 256 switches 22-0,1,2 ... 255 in block 22 so that each corresponding (+) input of interpolation amplifier 32 receives either VL or VH of the selected string resistor.

The delta-sigma modulation of the VH and VL pulse levels applied to the gate of the (+) input transistor selected by binary to 1 of N decoder 17 produces many transient pulse edges. For the delta-sigma modulation to be effective, the delta-sigma modulated pulses generated should have sharp, fast square wave edges. For example, large asymmetric transient glitch voltages superimposed on edges of the delta modulated pulses may cause significant errors in the DAC conversion results.

Figure 13:
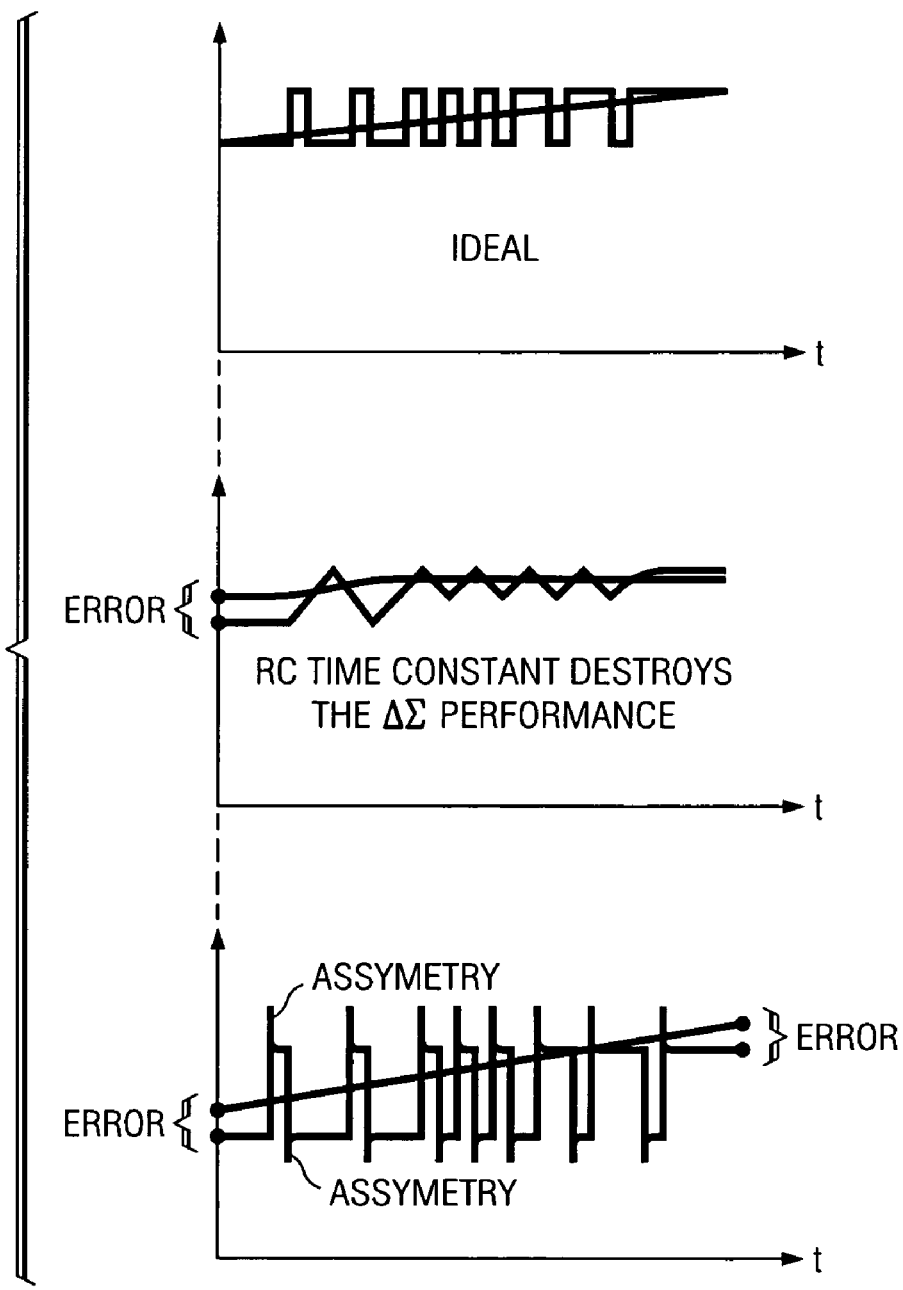
FIG. 13 is a timing diagram illustrating delta-sigma modulator characteristics that are referred to in explaining the present invention.

Referring FIG. 13, the upper graph illustrates the output of an ideal version of delta-sigma modulator 10 in response to incremental increasing or ramping of the value of the digital input word D<7:0>, and the straight line represents the resulting linear average of the output of the delta-sigma modulator. However, if the settling time of resistor string 15 is not fast enough, the delta sigma modulator output consists of saw-tooth-like pulses as shown in the middle graph in FIG. 13, due to RC time constants associated with the transitions of the delta sigma modulator. Such non-ideal output pulses cause in substantial nonlinearity in the average value of the delta sigma modulated output, as illustrated. Furthermore, when there are asymmetric voltage glitches superimposed on the edges of the delta-sigma modulator output pulses as illustrated in the bottom graph in FIG. 13, that causes errors in the average of the delta-sigma modulator output pulses which may tend to appear in the delta-sigma modulator output in the form of an offset or an offset combined with nonlinearity.

Figure 5:
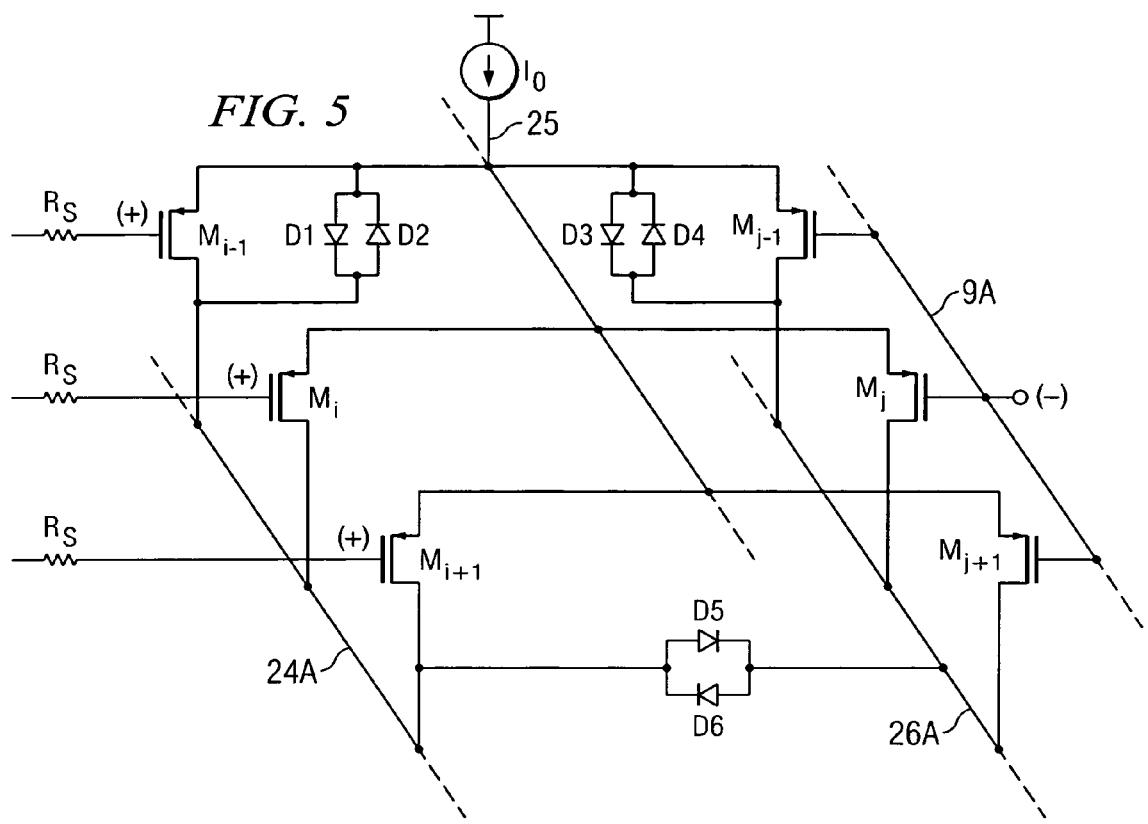
FIG. 5 is a schematic diagram of a technique for segmenting and protecting low-voltage transistors in the interpolation amplifier 32 of FIGS. 4A and 4B.

That is why the fast resistor string, the de-glitching schemes, and the low voltage operation are provided in accordance with the present invention along with use of the delta-sigma modulator to, in effect, over-sample the least significant bits of the 24-bit digital input word DIN. Specifically, the invention provides circuitry and methodology that reduce such glitch voltages to a sufficiently low level that substantial analog to digital conversion errors are avoided. The circuitry referred to includes the series resistors RS shown in FIGS. 4A and 4B coupled between the outputs of block 22 and the gates of the (+) input transistors of operational amplifier 32. Also, the subsequently described segmentation of the differential input transistor pairs and the use of low voltage input transistors and associated protection diodes for the segments as indicated in FIG. 5 operate to reduce the parasitic capacitance for each group of input transistors and reduce the glitch voltage magnitudes and durations and thereby contribute to substantially reduced glitch voltage magnitudes and durations and hence to substantially reduced digital to analog conversion errors.

Referring again to FIGS. 4A and 4B, the sources of (+) input transistors M0,1,2 . . . 255 are for simplicity illustrated as coupled by conductor 25 to a single tail current source 10, and their drains are coupled by conductor 24 to one input of a conventional folded cascode stage 28. The 256 (−) side corresponding input transistors are collectively illustrated as a single P-channel transistor M300 and their gates are connected by conductor 9A and feedback resistor RF to Vout on conductor 9. The sources of the 256 (−) side transistors M300 are connected to conductor 25 and their drains are connected by conductor 26 to another input of folded cascode stage 28. The outputs 29A and 29B of folded cascode stage 28 are connected to the inputs of a conventional class AB output stage 30, the output of which produces Vout on conductor 9. A feedback capacitor C is coupled in parallel with feedback resistor RF, and a gain setting resistor RG is connected between conductor 9A and ground. (The feedback from Vout to the (−) side inputs of the 256 transistors represented by M300 sets the gain of the operational amplifier 32 and the capacitor C limits its bandwidth.) The folded cascode transistors of the first stage can be gain boosted using conventional circuitry (not shown), and conventional slew boost circuitry (not shown) can be used to improve the output slew rate and settling time for fast-changing input voltages. Delta-sigma modulator 10 operates in response to an oscillator clock signal OSCLK and in response to the LSB subword bits D<7:0>.

In the described embodiments, delta-sigma modulator 10 modulates only the selected differential input transistor pair of interpolation amplifier 32, corresponding, for example, to the LSB of interpolation amplifier 8 after it has interpolated between the selected tap voltages VL and VH in response to the mid-subword D<15:8>. All of the switch pairs 22-0, 1 . . . 255 selected by signals SC0,1,2 . . . 255C produced by binary to 1 of N decoder 17 are connected to either the VH or VL voltage level of the corresponding signals A0,1, . . . 255 produced by block 20, except the one of the switch pairs coupled to the gate of the selected differential input transistor that is being delta sigma modulated between VH and VL in response to the C and CB signals applied to switches 22A and 22B by delta-sigma modulator 10.

Thus, the mid-bit subword D<15:8> goes to both binary to thermometer subword decoder 18 and binary to 1 of N subword decoder 17 to determine which differential transistor pair is to be delta-sigma modulated and apply the VH and VL voltage levels to the gates of the 255 other differential transistor pairs in accordance with the outputs of binary to thermometer decoder 18. The various signals A0,1 . . . 255 have a level VH or VL, respectively, and, except for the one to be delta-sigma modulated, are routed through switches 22-0,1 . . . 255 in block 22 directly through the corresponding series resistors RS directly to the gates of the 255 corresponding (+) side differential pair input transistors. (Series resistors RS help limit the bandwidth to reduce glitch voltages at the gates of the input transistors.) The remaining (+) differential pair input transistor is the one selected by binary to 1 of N decoder 17 to be delta-sigma modulated and is alternately switched between VH and VL in accordance with the output of delta-sigma modulator 10, through switch 22E.

To summarize, the circuitry in block 22 provides, for the voltage of the gate of the (+) side input transistor corresponding to the output of binary to 1 of N subword decoder 17, a delta-sigma modulated sequence of pulses each having a low level VL and a high-level VH determined by string DAC 4, and also produces, for the voltages of the gates of the other 255 (+) input transistors, either the VH or VL level, as determined by binary to thermometer subword decoder 18.

For lowering noise and increasing dynamic range, a high-voltage-capable CMOS process is used. Typically, the output amplifier requires a +−5 volt output, and therefore the low voltage input transistors of the interpolation amplifier must be protected by high voltage diode-connected CMOS transistors, which have large associated parasitic capacitances. To avoid large values of parasitic capacitance due to the pairs of protection diodes, the low voltage current sources are grouped together and protected with a single high voltage diode-connected transistor or pair of back-to-back diode-connected transistors.

FIG. 5 illustrates a technique wherein groups of differential pairs of the input stage of operational amplifier 32 in FIGS. 4A and 4B are segmented into groups in order to reduce the magnitude and duration of voltage glitches on the gates of the (+) input transistors without excessively increasing INL and DNL. This technique is needed to reduce parasitic loading due to the CMOS protection diodes; that is, the same protection diodes are shared between many transistors so that a separate pair of back-to-back protection diodes is not needed for each differential input transistor pair.

In FIG. 5, one such 8-bit section includes eight (+) input transistors, including low voltage transistors $M_{i-1}$, $M_i$, and $M_{i+1}$ and also includes eight (−) input transistors, including low voltage transistors $M_{j-1}$, $M_j$, and $M_{j+1}$. The sources of all of the foregoing 16 low-voltage transistors of the 8-bit section are connected by conductor 25 to a tail current source I0. The drains of all eight (+) side low-voltage transistors are connected to conductor 24A, and the drains of all eight (−) side low-voltage transistors are connected to conductor 26A, as shown. The gates of the eight (−) side transistors are coupled by conductor 9A to Vout, as shown in FIGS. 4A and 4B, and the gates of the eight (+) side transistors are coupled by series resistors RS to the various V0,1,2 . . . 255 signals, as shown in FIGS. 4A and 4B.

The embodiment of FIG. 3 shows a 6-bit interpolation amplifier, and those 6 bits require 64 segments, with each of the 64 segments being further segmented into 8 major segments each having eight sections each organized by binary decoding as a group of 4 differential input transistor pairs, a group of 2 differential input transistor pairs, and a group of 1 differential input transistor pair, whereby a first switch controls 4 differential input transistor pairs, a second switch controls 2 differential transistor input pairs, and a third switch controls 1 differential input transistor pair. That binary coding arrangement provides 8 selectable output levels. This type of segmentation is a decoding segmentation, rather than an analog hardware segmentation. The combined 3-bit binary segmentation of the differential input transistor pairs of the interpolation amplifier sub-DAC and the three-bit "unary segmentation" of the differential input transistor pairs provides the desired trade-off between Vout settling speed and DNL. Thus, 3 bits of the interpolation amplifier sub-DAC are "binary coded" and three bits thereof can be considered to be "unary coded".

In FIG. 5, the input stage transistors are implemented using conventional fast, low voltage transistors manufactured using conventional low voltage wafer fabrication processes. The gate voltages of the differential input transistor pairs are limited to values between 0 volts and −5 volts (by a 5 volt power supply from which the reference voltage applied across the resistor string is derived.) The source-drain voltage of each low voltage input transistor is clamped by the above-mentioned pairs of back-to-back diode-connected high-voltage CMOS transistors. The protection diodes are implemented using thick gate oxides, and their threshold voltage $V_T$ is greater than 2 volts. The high voltage diode-connected transistors which form the protection diodes D1-D6 are large and introduce significant amount of parasitic capacitance into the circuitry, making it impractical to split the tail currents as disclosed in above mentioned U.S. Pat. No. 6,246,351 (Yilmaz) so as to provide separate tail current sources for each differential input pair. For example, if the tail current is split into separate current sources for each of the differential input transistor pairs, then drain-source protection diodes are necessary for each input transistor pair, would greatly increase the large amount of parasitic capacitance associated with each differential input pair the circuit speed and therefore greatly decrease the circuit speed.

High voltage back-to-back protection diodes D1 and D2 (wherein the "anode" terminal of each is connected to the "cathode" terminal of the other) are connected between conductor 25 and conductor 24A to provide source-drain voltage protection for the (+) input transistors. Similarly, back-to-back high voltage protection diodes D3 and D4 are connected between conductor 25 and conductor 26A to provide a source-drain voltage protection for the (−) input transistors. Back-to-back protection diodes D5 and D6 are connected between conductors 24A and 26A, and protect the input transistors against large drain-drain voltage difference differences in of all of the differential input transistor pairs. The low-voltage transistors are manufactured using standard wafer processing, and the high voltage protection diode transistors are non-standard thick-gate-oxide transistors which nevertheless can be readily provided in high-voltage CMOS processes.

In the described embodiments of present invention, the tail current for each hardware segment goes through and is equally shared all of the time by each of the differential pairs in that segment. The three sets of protection diodes simultaneously protect three different aspects of all the corresponding differential pair input transistors.

Figure 1:
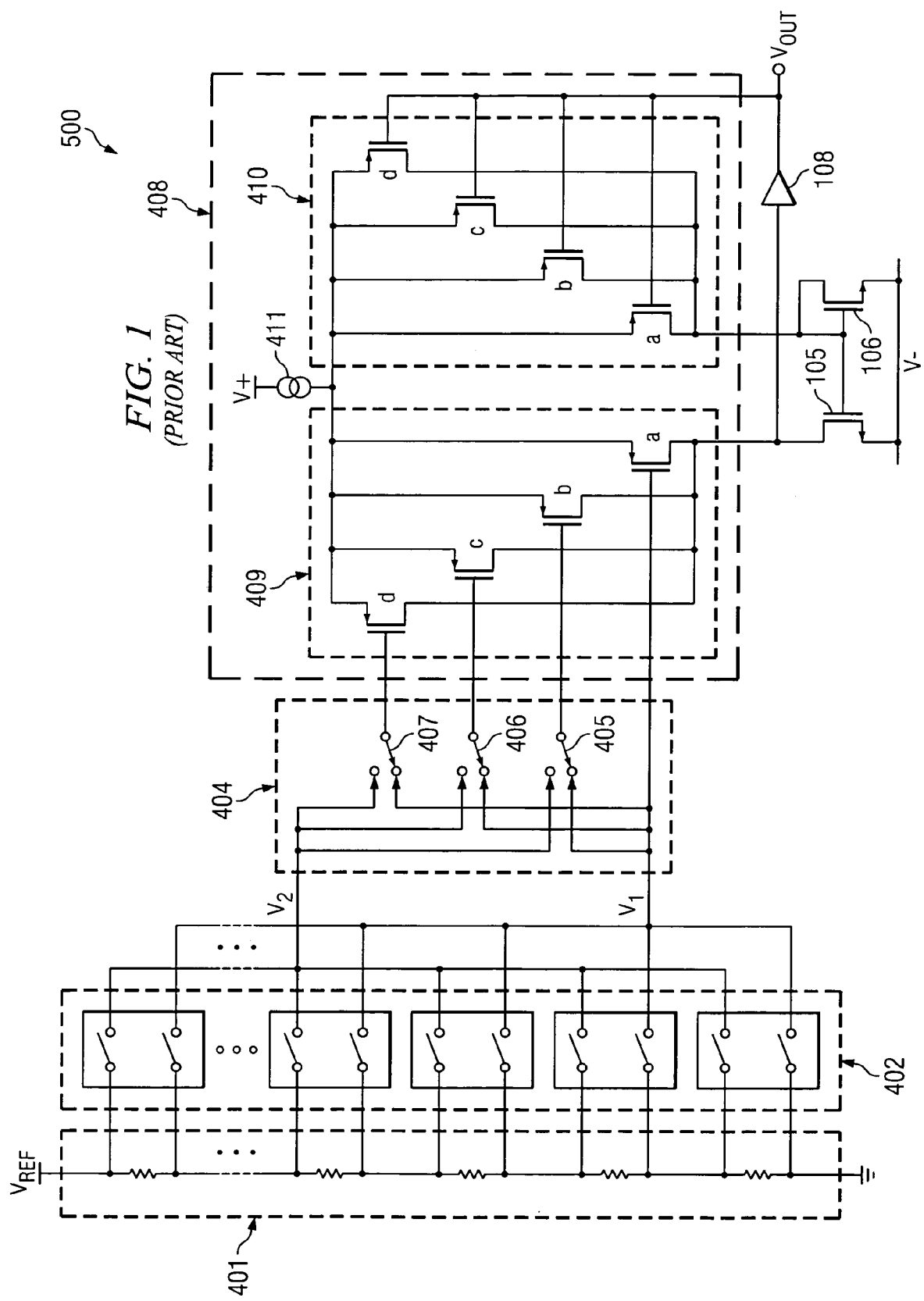
FIG. 1 is a diagram of a prior art DAC of the type including a string DAC as a first stage and an interpolation amplifier as a second stage as shown in FIG. 5 of U.S. Pat. No. 5,396,245.
Figure 2:
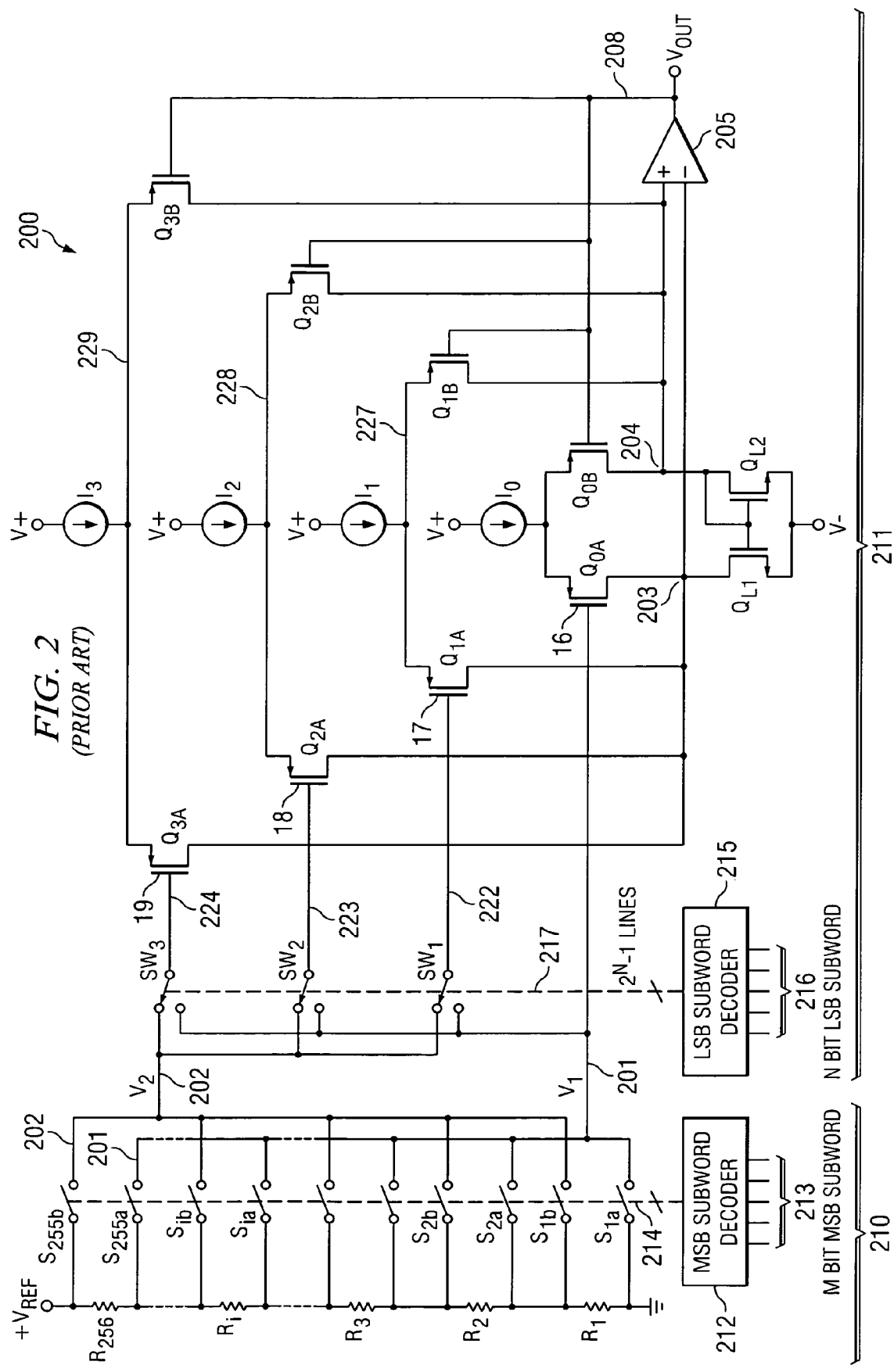
FIG. 2 is a diagram of a prior art DAC of the type including a string DAC as a first stage and an interpolation amplifier as a second stage as shown in FIG. 2 of U.S. Pat. No. 6,246,351.

It should be understood that if high voltage operation is not needed, then the technique indicated in Prior Art FIG. 2 of using a separate tail current source for each differential pair is preferable because INL and DNL are substantially improved. However, if high voltage operation of low-voltage differential pair transistors is needed in order to obtain signal voltages adequately higher than the noise of the interpolation amplifier, then the large parasitic capacitance associated with each of the three banks of protection diodes has to be distributed among a sufficient number of differential pairs to prevent the operating speed from being unacceptably reduced.

In the described embodiment of the invention, a combination of binary and unary coding is used, with multiple differential input transistor pairs connected to binary switches and capacitor-balanced differential input transistor pairs connected to unary switches, which reduces the durations and magnitudes of glitch voltages due to gate-to-drain charge injection. The following truth table shows an example of decimal, binary and thermometer codes from 0 to 7 (3 bits):

| decimal | binary | thermometer |
|---------|--------|-------------|
| 0 | 000 | 00000000 |
| 1 | 001 | 00000001 |
| 2 | 010 | 00000011 |
| 3 | 011 | 00000111 |
| 4 | 100 | 00001111 |
| 5 | 101 | 00011111 |
| 6 | 110 | 00111111 |
| 7 | 111 | 01111111 |

This optimization can balance glitch magnitude and duration versus Vout settling time. (Unary coding is the kind of coding performed by the thermometer decoder. If there are, for example, 64 differential pairs, they can be segmented into separate groups of 8 differential pairs; that is the unary part.)

Figure 6:
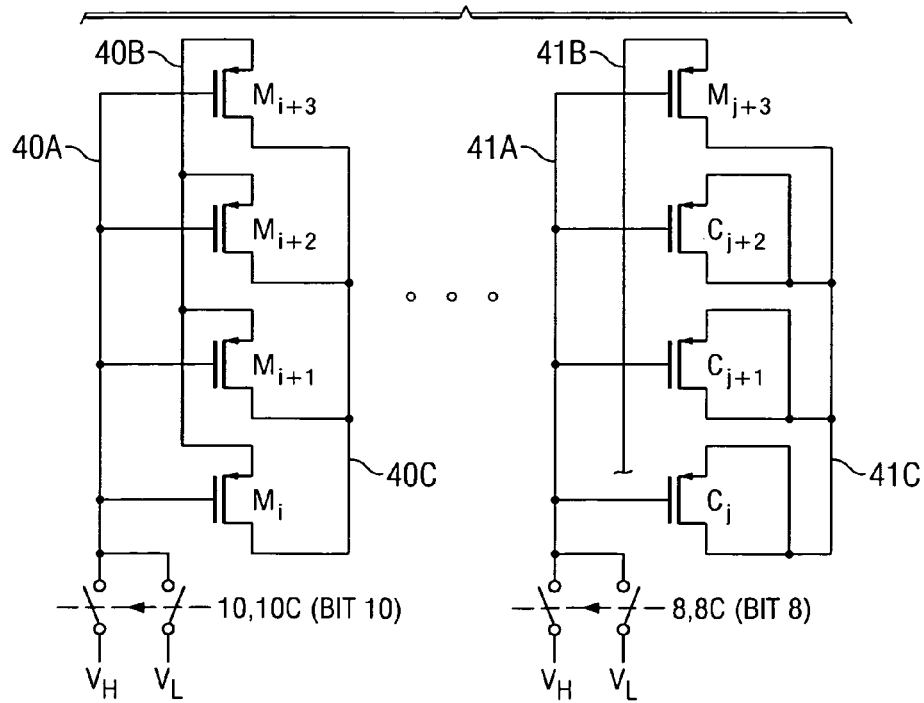
FIG. 6 is a schematic diagram of circuitry for reducing voltage glitches in the interpolation amplifier 32 of FIGS. 4A and 4B.

FIG. 6 shows the previously mentioned binary grouping of 4 (+)-side P-channel transistors $M_i$, $M_{i+1}$, $M_{i+2}$, and $M_{i+3}$ for bit number 10 of the digital input word DIN in FIGS. 4A and 4B, having their gates connected by one of switches 22-0,1 . . . 255 in block 22 of FIGS. 4A and 4B to conductor 40A, their sources connected to conductor 40B, and their drains connected to conductor 40C. (Any bit after bit 8, i.e., bits 7-0, may be involved in the delta-sigma modulation. For binary segmentation, bit 8 actually selects 1 transistor, bit 9 selects 2 transistors, and bit 10 selects 4 transistors.) Thus, a single multiplexer switch injects charge onto the combined capacitances of four, rather than one, (+) side P-channel transistors $M_i$, $M_{i+1}$, $M_{i+2}$, and $M_{i+3}$. This results in a substantial reduction in the magnitude and duration of the voltage glitch produced on conductor 40A as result of closing the multiplexer switch.

Similarly, FIG. 6 also shows a grouping of the 4 (+)-side P-channel capacitor-connected transistors $C_j$, $C_{j+1}$, and $C_{j+2}$ and a P-channel transistor $M_{j+3}$ for bit number 8 of the digital input word DIN all having their gates connected to conductor 41A and their drains connected to conductor 41C. The sources of capacitor-connected transistors $C_j$, $C_{j+1}$, and $C_{j+2}$ are connected to their drains, and the source of transistor $M_{j+3}$ is connected to conductor 41B. Thus, a single multiplexer switch in block 22 of FIGS. 4A and 4B injects charge onto the combined capacitances of four, rather than one, (−) side P-channel transistors, i.e., $C_j$, $C_{j+1}$, and $C_{j+2}$ and P-channel transistor $M_{j+3}$. The capacitor-connected dummy transistors $C_j$, $C_{j+1}$, and $C_{j+2}$ actually are simply dummy capacitors which function only to absorb injected charge so as to reduce the glitch voltage magnitude and duration on conductor 41A so that when the multiplex switches for bit 8 close, the resulting glitch voltage spikes on conductor 41A is substantially reduced. Thus the large capacitor-connected transistors $C_j$, $C_{j+1}$, and $C_{j+2}$ in the circuit act like large bypass capacitors to absorb the injected charge and reduce the resulting gate voltage glitch.

It should be understood that for the case of, for example, 6-bit unary coding, up to 128 switches can switch at the same time, causing unacceptable glitch voltages due to charge injection into the positive input of the interpolation amplifier. Binary coding can reduce this charge injection so that up to 16 switches can simultaneously switch. Full binary coding could result in DNL error. This glitch can be reduced without sacrificing DNL by using the previously described 3 bit unary coding and 3 bit binary coding. Then, up to 22 switches can switch simultaneously, improving the glitch voltage by a factor of 128/22. Moreover, the input capacitance that each unary coded switch "sees" is increased because each unary switch now "sees" 8 differential pair transistors instead of 1, further reducing the glitch voltages.

Adequately fast settling speed of DAC resistor string 15 in FIGS. 4A and 4B is required for DAC 1 of the present invention to achieve the initially fast settling indicated by portion A in the previously mentioned graph of Vout versus time included in FIG. 3. For example, when a DAC conversion operation requires switching from a resistor at the bottom of resistor string 15 to the a resistor at the top thereof, there is an associated RC time constant that slows down the signal settling speed of the entire resistor string circuit. Reducing the glitch voltage is very important to obtaining effective delta-sigma modulator modulation of the gate voltage pulses of the differential input transistor selected by binary to 1 of N subword decoder 17 because the gate voltage pulse needs to remain at a VH level for a sufficient duration. That is, the glitch voltage duration must be much less than the width of the narrowest pulse produced by delta-sigma modulator 10 in order for Vout to achieve the desired accuracy and resolution from the delta-sigma modulation.

To achieve good settling speed and high resolution, DAC 1 preserves the bandwidth of the interpolation amplifier by keeping the output voltage span of the resistor string 15 at a maximum value. The string resistors R0,1,2 ... 255 each have an identical resistance R and are individually decoded to improve glitch performance, and the impedance of resistor string 15 is significantly reduced, as subsequently explained with reference to FIG. 9, in order to improve signal settling speed. The resistor string DAC 4 outputs two selected tap voltages VH and VL which are selected by MSB subword decoder 14 in response to the MSB subword bits D<23:16> provided as inputs to interpolation amplifier sub-DAC 8.

Figure 7:
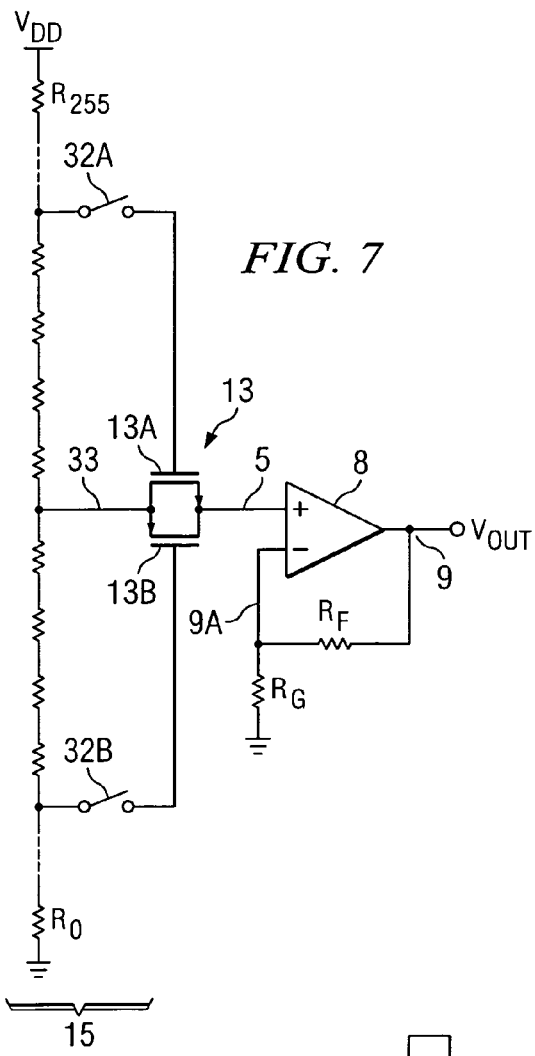
FIG. 7 is a schematic diagram of a bootstrap switch circuit which can be advantageously used in the string DAC 4 of FIGS. 4A and 4B.

FIG. 7 shows an implementation of resistor string 15 of 8-bit string DAC segment 4 in FIGS. 4A and 4B including CMOS transmission gate's functioning as a switches between each tap point of resistor string 18, respectively. For simplicity of illustration, only one such CMOS transmission gate 13 is shown, coupled between one tap point 33 and conductor 5 of FIGS. 4A and 4B. Another similar CMOS switch is connected between the other tap point of the same string resistor and conductor 6 of FIGS. 4A and 4B. As in FIGS. 4A and 4B, conductors 5 and 6 are coupled to interpolation amplifier sub-DAC 8, which for simplicity is illustrated simply as an operational amplifier, including its feedback resistor RF and its gain resistor RG. The gate of P-channel transistor 13A of CMOS transmission gate 13 is coupled by a corresponding switch 32A to a tap point located sufficiently higher in resistor string 15 than tap point 33 to ensure an adequate "bootstrapped" VGS voltage for P-channel transistor 13A. Similarly, the gate of the N-channel transistor 13B of CMOS transmission gate 13 is coupled by a corresponding switch 32B to a tap point located sufficiently lower in resistor string 15 than tap point 33 to ensure an adequate "bootstrapped" VGS voltage for N-channel transistor 13B. Switches 32A and 32B are controlled by MSB subword decoder 14. For additional pairs of CMOS transmission gates (not shown) which select the upper and lower tap points of string resistors higher or lower than tap point 33, the switches corresponding to switches 32A and 32B also are located correspondingly higher or lower along resistor string 15 so as to ensure adequate VGS voltages so as to achieve the desired signal speed and accuracy.

Figure 8:
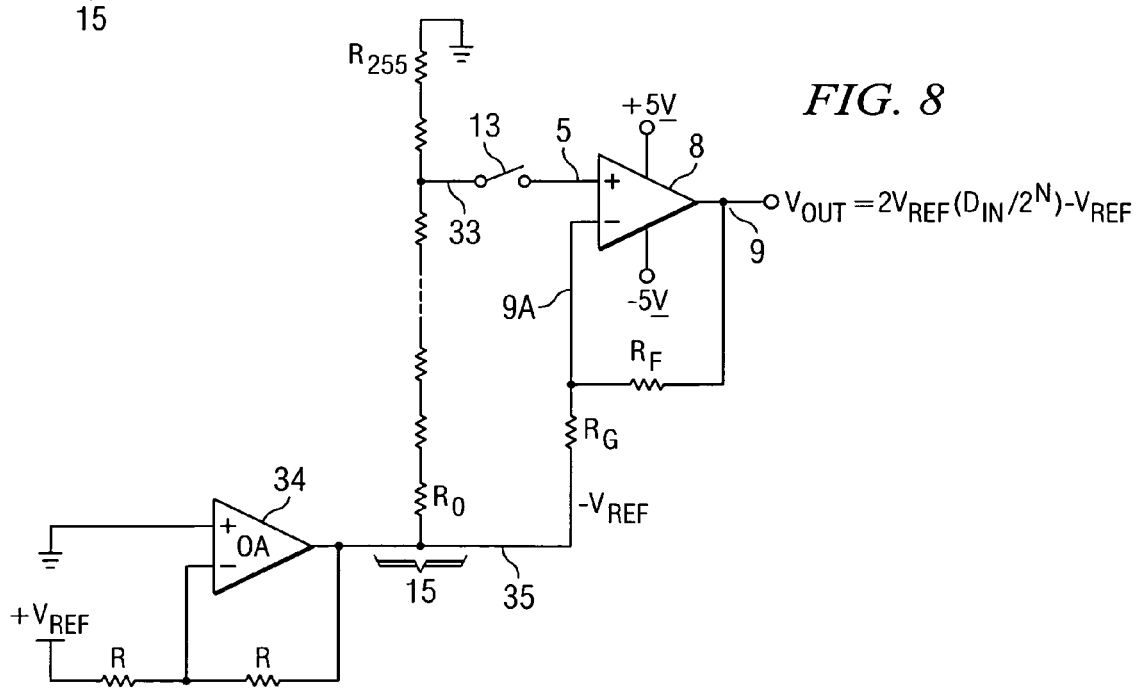
FIG. 8 is a schematic diagram illustrating a technique for increasing the accuracy and output voltage range of the DAC shown in FIGS. 4A and 4B.

In a preferred embodiment, the digital circuitry of DAC 1A operates on supply voltages between −5 volts to 0 volts, DAC resistor string 15 is designed to operate on supply voltages between −5 volts to 0 volts, and the amplifier uses a closed loop gain of 2 in order to achieve a +−5V output range. FIG. 8 shows circuitry associated with DAC resistor string 15 to internally generate a negative reference voltage −Vref from a positive reference voltage +Vref. The resistor string 15 is coupled between ground and −Vref. For simplicity of illustration, in FIG. 8 interpolation amplifier sub-DAC 8 is represented simply as an operational amplifier including its feedback resistor RF and its gain resistor RG. To generate −Vref, the (+) input of an operational amplifier 34 is connected to ground. The (−) input of operational amplifier 34 is connected to one terminal of a resistor having a resistance R, with its other terminal connected to +Vref and also to one terminal of a feedback resistor having a resistance R and another terminal coupled by conductor 35 to the output of operational amplifier 34. The internal reference voltage −Vref generated by operational amplifier 34 is applied to the lower end of resistor string 15 and to one terminal of gain resistor RG, which has its other terminal connected by conductor 9A to the (−) input of interpolation amplifier sub-DAC 8 and to one terminal of feedback resistor RF, which has its other terminal connected by output conductor to Vout. The value of Vout for the arrangement shown in FIG. 8 is equal to the expression 2 Vref (DIN/$2^N$)−Vref. This configuration for biasing resistor-string 15 has the advantages of increasing the incremental voltage drop across each string resistor and thereby increasing the accuracy and resolution of DAC 1A of FIGS. 4A and 4B, thereby preserving the bandwidth of interpolation operational amplifier 32. The arrangement of FIG. 8 also avoids the use of an analog bottom reference voltage rail for the bottom reference voltage of resistor string 15 and thereby avoids imparting of any noise on an analog bottom reference voltage rail to resistor-string 15, and also improves the power-supply rejection ratio.

Figure 9:
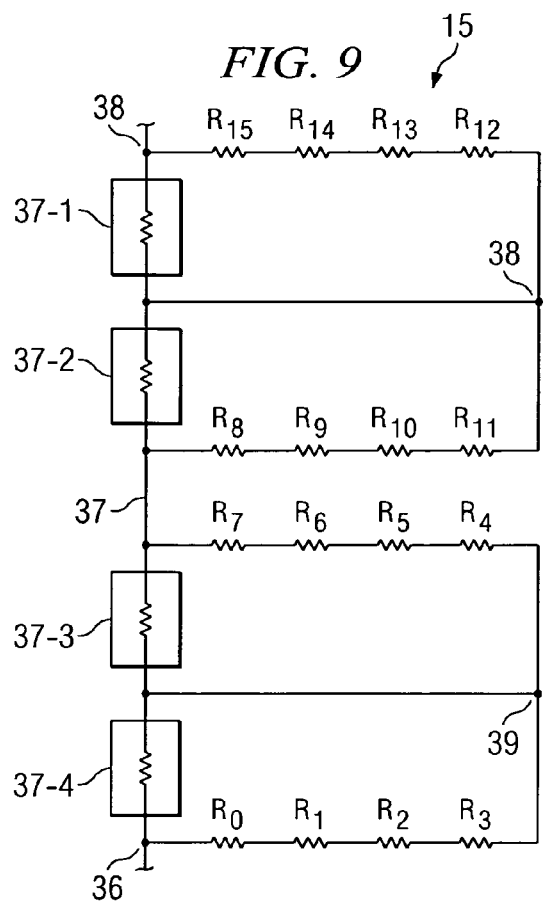
FIG. 9 is a schematic diagram of a fast string resistor circuit structure that can be utilized in the string DAC 4 of FIGS. 4A and 4B.

FIG. 9 illustrates one aspect of a preferred configuration for increasing the speed of resistor-string 15. Equal-resistance string resistors R0,1 ... 7 form a lower loop between tap points 36 and 37. Two "bypass" resistors 37-3 and 37-4 are connected in series between tap points 36 and 37 to complete the lower loop. The tap point 39 located midway between string resistors R3 and R4 is connected to the junction between bypass resistors 37-3 and 37-4. String resistors R0,1 ... 15 form a similar or identical upper loop between tap points 37 and 38, with two bypass resistors 37-1 and 37-2 connected in series between tap points 37 and 38 to complete the upper loop. The tap point 38 between string resistors R11 and R12 is connected to the junction between bypass resistors 37-1 and 37-2. The benefit of this configuration is to provide much faster settling times for resistor string 15. The bypass resistors create very low impedance paths between the top and bottom of resistor string 15 and also create very low impedance paths from the loop mid-points 38 and 39 to the lower reference voltage to which resistor string 15 is connected. The low impedance paths results in significantly faster settling times of the resistor string.

Figure 10:
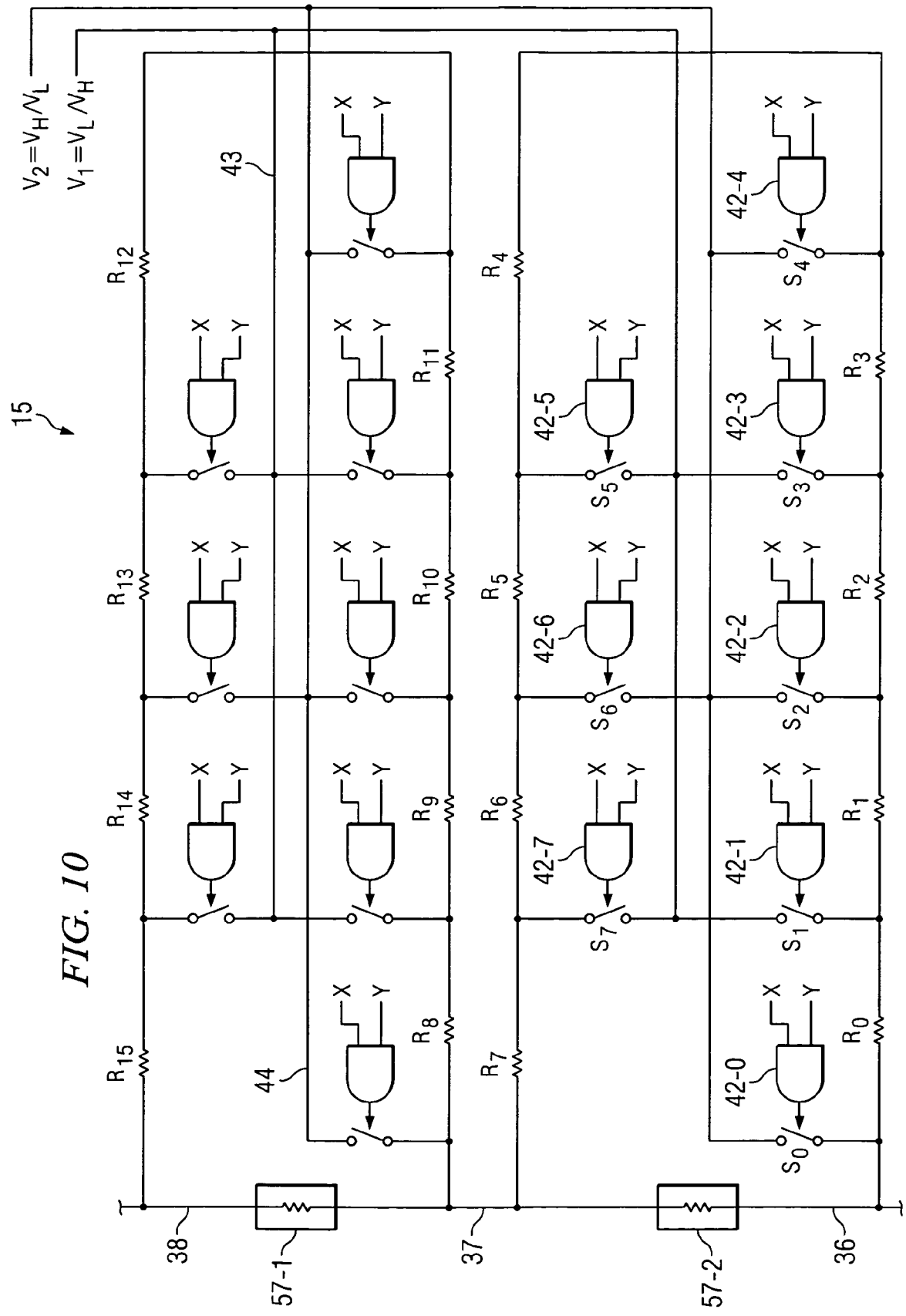
FIG. 10 is a schematic diagram of an X-Y decoding technique that can be utilized in the string DAC 4 of FIGS. 4A and 4B.

FIG. 10 illustrates another aspect of resistor string 15, wherein the upper tap voltage point and lower tap voltage point of each string resistor can be simultaneously selected using X-Y (row-column) decoding, using only a single switch at each resistor string tap point. String resistors R0, 1 . . . 7 form a lower loop between tap points 36 and 37, and bypass resistor 57-2 is connected between tap points 36 and 37. Similarly, string resistors R0,1 . . . 15 form an upper loop between tap points 37 and 38, and bypass resistor 57-1 is connected between tap points 37 and 38. In the lower loop, switches S1,2 . . . 7 are alternately connected between successive tap points of resistors R0,1 . . . 7 and conductors 44 and 43, as shown. Each successive switch S1,2 . . . 7 is controlled by a corresponding X-Y decoding AND gate 42-0,1 . . . 7, respectively, each having an input coupled to the X output of a row decoder (not shown) included in MSB subword decoder 14 and another input coupled to the Y output of a column decoder (not shown) included in MSB subword decoder 14. The upper loop in FIG. 10 is similarly configured.

The voltages V1 on conductor 44 and V2 on conductor 43 each alternate between being equal to VH and VL for alternate tap voltages. MSB subword decoder 14 is designed to to recognize when a particular tap voltage is the VH of the string resistor below it or the VL of the string resistor above it and accordingly couple it to the VH or VL input of interpolating amplifier sub-DAC 8.

In FIG. 10, assume, for example, that the two AND gates driving switches S0 and S1 and connected to string resistor R0 are initially connected to provide the voltage on conductor 36 as a VL tap voltage and to provide the voltage on switch S1 as a VH tap voltage. Then, if the voltage across string resistor R1 is to be interpolated next, switch S0 is turned off, switch S1 remains on but represents the VLtap voltage of string resistor R1, and switch S2 is turned on and its voltage now represents the VH tap voltage of string resistor R1. Thus, only one switch, rather than two, is turned on in this process, and that substantially reduces the glitch voltage on the gates of the (+) side input transistors of interpolation operational amplifier 32. This configuration is useful for a monotonically increasing or decreasing ramp signal.

Figure 11:
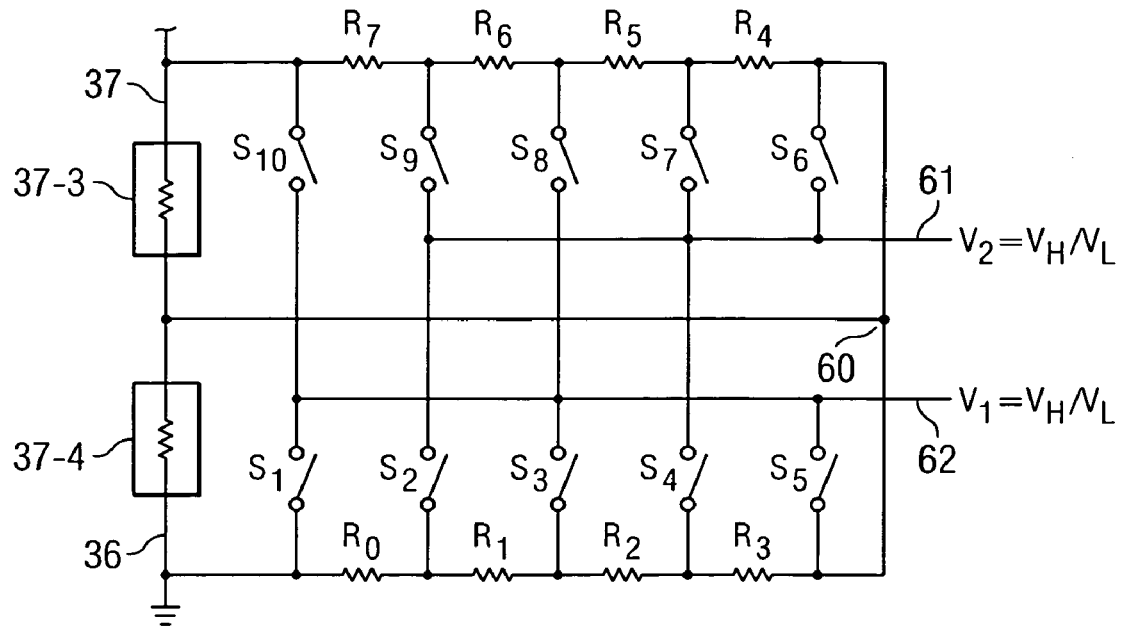
FIG. 11 is a schematic diagram of switching and pre-charging technique that can be utilized in the string DAC 4 of FIGS. 4A and 4B.

FIG. 11 illustrates yet another aspect of resistor string 15, wherein string resistors R0,1 . . . 7 form a loop including bypass resistors 37-3 and 37-4, with the tap point 60 between string resistors R3 and R4 being coupled to the junction between bypass resistors 37-3 and 37-4, as in above-described FIG. 9. Switches S1,2 . . . 10 are alternately coupled between "floating" conductors 62 and 61 and successive tap points of resistors R0,1 . . . 7, respectively, as shown. Switches S1,2 . . . 10 can be controlled by X-Y decoding gates as shown in FIG. 10. (There is a set of secondary switches (not shown) that connects one of the many precharged lines in 256-resistor string DAC 15 to the final VH or VL conductors 5 and 6 in FIGS. 4A and 4B. Therefore, there are two precharged conductors for the mid-point of each loop, and depending on the decoding, they may or may not get connected to VH or VL conductors 5 and 6. For example, in the 10-bit resistor string (not shown) would be included in string DAC 4 of FIG. 3 there are 16 loops and hence 16 mid-points and 16 pairs of precharged conductors. Only 2 out of the 16 precharged conductors would be switched to the VH or VL conductors 5 and 6.)

In operation, each resistor string row has its output conductors 61 and 62 pre-charged to the mid-point voltage on conductor 60 through a low impedance path entirely through bypass resistors such as 37-3 and 37-4, not through a high impedance path including a large number of string resistors R0,1 . . . 255. This substantially improves the precharging speed. Switches S5 and S6 are used to connect conductors 61 and 62 to the center tap voltage on conductor 60 during regular decoding operation and also to precharge conductors 61 and 62 to the midpoint voltage on conductor 60. A benefit of the structure shown in FIG. 11 is that the precharging current is able to propagate through a low resistance path including only bypass resistors such as 37-3 and 37-4 to ground or a negative reference voltage, without having to flow-through a higher resistance path including string resistors, and therefore is much faster than the prior art.

Figure 12:
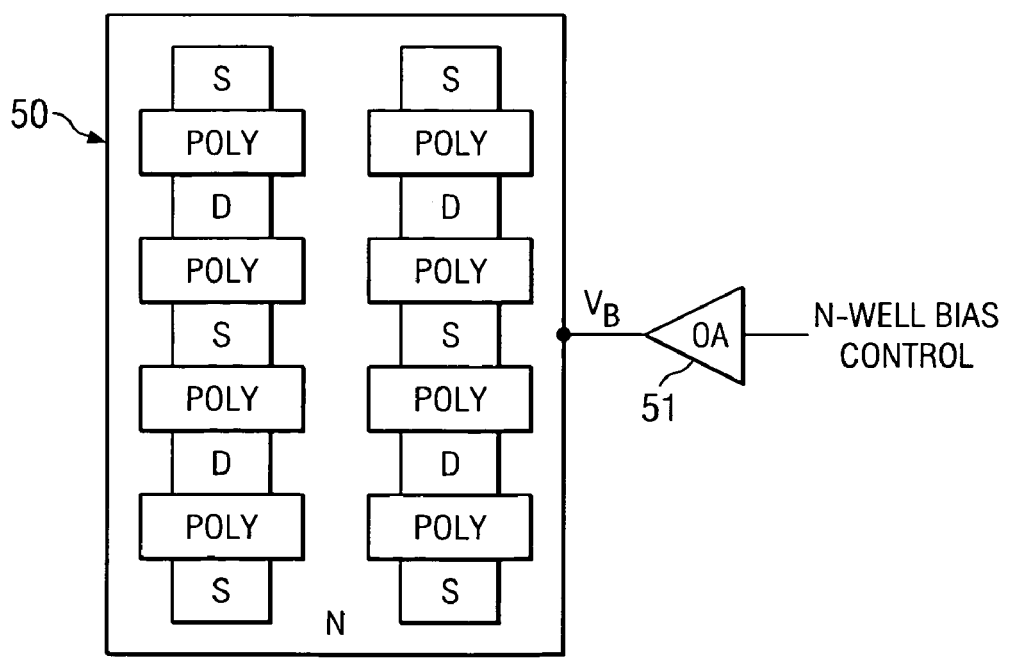
FIG. 12 is a diagram illustrating use of multiple P-channel interpolation amplifier input transistors in an N-well biased by an amplifier such that the N—N-type well bias voltage follows the value of the digital input word of the DAC shown in FIGS. 4A and 4B.

To reduce parasitic capacitances and the body effect on the threshold voltages of the P-channel differential pair input transistors, the PMOS diff-pair array is laid out compactly and placed in a single N-type region 50, i.e., an "N-well" 50, shown in FIG. 12 of the integrated circuit, and a separate amplifier 51 drives the N-well bias voltage, as shown in FIG. 12. In interpolation operational amplifier 32, all differential input transistor pairs share the same N-well bias potential, which is driven by amplifier 51 and reduces the transistor threshold body effect and also reduces parasitic N-well-to-substrate capacitance, thereby improving the circuit speed. The input voltage of bias amplifier 51, which is the signal N-WELL BIAS CONTROL in FIG. 12, is adjusted indirectly in response to the applied input voltage level in order to reduce the body effect on the differential input transistor pair threshold voltage.

In FIG. 12, the polycrystalline silicon gates and the source and drain connections of the P-channel differential input pair transistors are shown. One of the illustrated stacks of transistors includes (+) side input transistors and the other stack includes (−) side input transistors, all disposed in the same N-well 50 which is biased by operational amplifier 51. The input of operational amplifier 51 causes it to operate so as to maintain a constant source-to-bulk voltage of the differential input pair transistors in N-well region 50. The input voltage of operational amplifier 50, and hence its output voltage applied to N-well 50, "follows" Vout of interpolation operational amplifier 32. The source voltages of the differential input pair transistors disposed in N-well 50 are a function of the digital input word DIN by virtue of the way interpolation operational amplifier 32 operates in response to DIN. Consequently, the source-to-bulk voltage of the differential input pair transistors is essentially constant, resulting in improved digital to analog conversion accuracy.

To summarize, both the P-channel transistor and the N-channel transistor of each CMOS transfer gate switch are simultaneously bootstrapped as shown in FIG. 7. Using CMOS transfer gate switches a larger resistor string output voltage which preserves the interpolation amplifier bandwidth and provides a substantial speed improvement. Precharging the two busses 61 and 62, rather than one, in FIG. 11 and using a low impedance rather than a high impedance path through the string DAC 15 results in a substantially improved string DAC settling time.

Interpolation operational amplifier 32 can provide over 10 MHz bandwidth, an open loop gain of over 96 dB, 1 microsecond settling to 16-bit accuracy, and draws only about 4.3 mA of power supply current, provides exceptionally low noise (12 nV/rtHz (nanovolts per square root of Hertz)), and has less than 100 nanosecond small-signal settling time to within +−0.5 mV of the desired absolute value of Vout.

The foregoing embodiment of the invention provides more than an order of magnitude reduction of DAC output voltage settling times compared to state-of-the-art audio digital-to-analog converters that utilize single-bit or multi-bit delta-sigma modulation and are characterized by long settling times.

For example, the 24-bit DAC architecture shown in FIG. 3, including 10-bit resistor string 4, a 6-bit interpolation amplifier 8, and an 8-bit delta-sigma modulator 10, will provide fast settling of the DAC output voltage Vout to within 16-bit accuracy in as little as 2 microseconds and to within 24-bit accuracy in less than 10 microseconds. This is a significant improvement in the DAC output voltage settling times of the prior art, and also provides a significant improvement in the out-of-band-noise compared to conventional delta-sigma DACs.

Although the filtered output of delta-sigma modulator 10 is slow, the advantage of the above described fast string DAC and interpolation amplifier sub-DAC architecture is that the slow delta-sigma modulator operation is applicable only to a final 5 millivolt or even only a 1 millivolt range of Vout. However, very fast settling of the interpolation amplifier output voltage Vout is achieved through the 0-3 volt portion of its range, i.e., to within 16 bit accuracy, and settling of the modulated interpolation amplifier output voltage is slow only in the range from 3000 to about 3001 to 3005 millivolts, which for many uses is acceptable and provides much faster settling than the closest prior art.

Delta sigma modulating the LSB at 16 times over-sampling ratio results in a 24-bit high-speed DAC, with a fast settling to an accuracy of 16 bits, and slower settling to an accuracy of 24 bits. However, this settling will still be orders of magnitude faster than that of traditional delta sigma modulators.

The described DAC architecture also can provide 24-bits of resolution with 10 microsecond settling to within +−0.01 millivolts of absolute accuracy relative to the voltage reference by using the described three section architecture and methodology.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A DAC (digital to analog converter) for converting a digital input word including an M-bit MSB subword, an N-bit mid-subword, and a P-bit LSB subword to an analog output signal, the DAC comprising:
   (a) a string DAC including $2^M$ string resistors each sequentially connected to the next by a plurality of tap voltage conductors, respectively, a first group of switches for selectively coupling an upper tap voltage of a selected string resistor to one of a first string DAC output conductor and a second string DAC output conductor and for selectively coupling a lower tap voltage of the selected string resistor to the other of the first and second string DAC output conductors in accordance with decoding of the M-bit MSB subword by a MSB subword decoder;
   (b) an interpolation sub-DAC for monotonically interpolating a voltage between the first and second string DAC output conductors in response to decoding of the N-bit mid-subword by a first decoder, the interpolation sub-DAC including
      i. interpolation operational amplifier circuitry including $2^N$ differential transistor pairs, and
      ii. multiplexing circuitry receiving the upper and lower tap voltages from the first and second string DAC output conductors for distributing the upper and lower tap voltages to various inputs of the differential transistor pairs in response to outputs of the first decoder in accordance with values of the N-bit mid-subword; and
   (c) a P-bit delta sigma modulator for producing a delta sigma modulated signal including sequences of pulses the density of which correspond to values of the P-bit LSB subword and applying the delta sigma modulated signal to an input of the multiplexing circuitry to control alternate supplying of the upper and lower tap voltages to an input of a differential transistor pair of the interpolation operational amplifier circuitry selected by a second decoder in accordance with the N-bit mid-subword to monotonically average a contribution of the selected differential transistor pair to generation of the analog output signal in accordance with the values of the P-bit LSB subword.

2. The DAC of claim 1 wherein M is equal to 8, N is equal to 8, and P is equal to 8.

3. The DAC of claim 1 wherein all of the differential transistor pairs are disposed in semiconductor well material biased at a common bulk bias voltage by a bias amplifier.

4. The DAC of claim 3 wherein the bias amplifier generates the common bulk bias voltage in response to a signal representative of the analog output signal.

5. The DAC of claim 1 wherein the differential transistor pairs each include a first input transistor and a second input transistor having their sources coupled together, gates of the second input transistors being coupled to feedback from the analog output signal, gates of the first input transistors being the various inputs of the differential transistor pairs receiving the distributed upper and lower tap voltages.

6. The DAC of claim 5 wherein the differential transistor pairs are P-channel differential transistor pairs.

7. The DAC of claim 1 wherein the interpolation operational amplifier includes a first group of differential transistor pairs which are grouped together by binary decoding and a second group of differential transistor pairs which are grouped together by unary decoding to reduce the glitch voltages on gates of transistors of the first group due to injected charge from a single switch actuated in order to select the first group.

8. The DAC of claim 7 including a sub-group of transistors of the second group which are capacitor-connected so as to reduce glitch voltage on a conductor coupled to gates of the transistors of the second group due to injected charge from another single switch actuated in order to select the second group.

9. The DAC of claim 5 wherein the differential transistor pairs are grouped into a plurality of groups, each group including a plurality of the differential transistor pairs wherein sources of the first and second transistors of that group are connected by a common source conductor to a corresponding tail current source, drains of the first transistors of that group being coupled to a first conductor, drains of the second transistors of that group being coupled to a second conductor, wherein the transistors of the plurality of differential transistor pairs are low voltage transistors, each group including a first voltage clamp coupled between the common source conductor and the first conductor, a second voltage clamp coupled between the common source conductor and the second conductor, and a third voltage clamp coupled between the first conductor and the second conductor, wherein each of the first, second, and third clamp circuits includes a pair of back-to-back diode-connected high voltage transistors.

10. The DAC of claim 1 wherein the $2^M$ string resistors are arranged in a plurality of loops, each loop having a mid-point and including a first bypass resistor, the bypass resistors of the loops forming a direct low-impedance path between a first reference voltage and a second reference voltage.

11. The DAC of claim 10 wherein each loop includes a second bypass resistor, each loop including a mid-point connected directly to a junction between the first and second bypass resistors.

12. The DAC of claim 10 including a second group of switches coupling alternate successive tap voltage points between the string resistors to the first and second string DAC output conductors, respectively, and a plurality of X-Y decode circuits coupled to the second group of switches and operative to couple both tap voltages of a selected string resistor to the first and second string DAC output conductors.

13. The DAC of claim 1 wherein the switches of the first group are CMOS transmission gate switches.

14. The DAC of claim 13 wherein the gate of a P-channel transistor of each CMOS transmission gate switch is bootstrap-coupled to a substantially lower voltage tap voltage conductor than a voltage of a tap conductor to which a source or drain of that P-channel transistor is connected and wherein the gate of a N-channel transistor of that CMOS transmission gate switch is bootstrap-coupled to a substantially higher voltage tap voltage conductor than the voltage of the tap conductor to which the source or drain of that P-channel transistor is connected, to ensure fast, accurate sampling of the tap voltage of the voltage tap conductor to which the source or drain of that P-channel transistor is connected.

15. The DAC of claim 11 including a second group of switches coupling alternate successive tap voltage points between the string resistors to the first and second string DAC output conductors, respectively, and a plurality of X-Y decode circuits in each loop coupled to corresponding switches of the first group and operative to couple both tap voltages of a selected string resistor to the first and second string DAC output conductors, and also including first and second switches of the second group adjacent to the midpoint of a particular loop operatively coupled in response to first and second X-Y decode circuits to precharge the first and second string DAC output conductors to the voltage of the mid-point of that loop.

16. The DAC of claim 1 wherein a ground reference voltage is applied to an upper end conductor of the $2^M$ string resistors and an internally generated negative reference voltage is applied to a lower end conductor of the $2^M$ string resistors.

17. The DAC of claim 16 including an operational amplifier having a first input coupled to the ground reference voltage and a second input coupled by a gain resistor to a positive reference voltage and also coupled by a feedback resistor to the lower end conductor to generate the internally generated negative reference voltage.

18. The DAC of claim 17 wherein the interpolation sub-DAC is referenced to the internally generated negative reference voltage to produce the analog output signal as an analog output voltage Vout having a value given by the expression $V\text{out}=2*V\text{ref}*(DIN/2^N)-V\text{ref}.$ 19. A method of converting a digital input word including an M-bit MSB subword, an N-bit mid-subword, and a P-bit LSB subword to an analog output signal, the method comprising:

(a) selectively coupling upper and/or lower tap voltages of a selected string resistor of a string DAC including $2^M$ string resistors each sequentially connected to the next by a plurality of tap voltage conductors, respectively, by means of a plurality of switches to first and second string DAC output conductors in accordance with decoding of the M-bit MSB subword;

(b) monotonically interpolating a voltage between the first and second string DAC output conductors by means of operational amplifier circuitry including $2^N$ differential transistor pairs in response to decoding of the N-bit mid-subword by a first decoder; and (c) monotonically averaging a contribution of at least one of the differential transistor pairs selected in accordance with values of the N-bit mid-subword to generation of the output signal by producing a delta sigma modulated signal including sequences of pulses the density of which correspond to values of the P-bit LSB subword and applying the upper and lower tap voltages of a selected string resistor to an input of the selected differential transistor pair in response to the delta sigma modulated signal.

20. A DAC (digital to analog converter) for converting a digital input word including an M-bit MSB subword, an N-bit mid-subword, and a P-bit LSB subword to an analog output signal, the DAC comprising:

(a) means for selectively coupling upper and/or lower tap voltages of a selected string resistor of a string DAC including $2^M$ string resistors each sequentially connected to the next by a plurality of tap voltage conductors, respectively, by means of a plurality of switches to first and second string DAC output conductors in accordance with decoding of the M-bit MSB subword;

(b) means for monotonically interpolating a voltage between the first and second string DAC output conductors by means of operational amplifier circuitry including $2^N$ differential transistor pairs in response to decoding of the N-bit mid-subword by a first decoder; and (c) means for monotonically averaging a contribution of at least one of the differential transistor pairs selected in accordance with values of the N-bit mid-subword to generation of the output signal by producing a delta sigma modulated signal including sequences of pulses the density of which correspond to values of the P-bit LSB subword and applying the upper and lower tap voltages of the selected string resistor to an input of a selected differential transistor pair in response to the delta sigma modulated signal.

* * * * *